US008058642B2

(12) United States Patent
Iguchi et al.

(10) Patent No.: US 8,058,642 B2
(45) Date of Patent: Nov. 15, 2011

(54) LIGHT-RECEIVING DEVICE

(75) Inventors: Yasuhiro Iguchi, Osaka (JP); Hiroshi Okada, Itami (JP); Yuichi Kawamura, Sakai (JP)

(73) Assignees: Sumitomo Electric Industries, Ltd., Osaka-shi (JP); Osaka Prefecture University Public Corporation, Sakai-shi (JP)

(*) Notice: Subject to any disclaimer, the term of this patent is extended or adjusted under 35 U.S.C. 154(b) by 178 days.

(21) Appl. No.: 12/443,575

(22) PCT Filed: Jul. 18, 2008

(86) PCT No.: PCT/JP2008/062986
§ 371 (c)(1), (2), (4) Date: Mar. 30, 2009

(87) PCT Pub. No.: WO2009/014076
PCT Pub. Date: Jan. 29, 2009

(65) Prior Publication Data

US 2010/0072457 A1 Mar. 25, 2010

(30) Foreign Application Priority Data

Jul. 23, 2007 (JP) ................................ 2007-190281

(51) Int. Cl.
*H01L 31/0352* (2006.01)

(52) U.S. Cl. ................................ 257/21; 257/E31.032

(58) Field of Classification Search ..................... 257/21
See application file for complete search history.

(56) References Cited

U.S. PATENT DOCUMENTS 6,252,287 B1 * 6/2001 Kurtz et al. .................. 257/461
6,728,283 B2 * 4/2004 Kudo et al. ............. 372/45.011
2003/0086461 A1 5/2003 Kudo et al.

(Continued)

FOREIGN PATENT DOCUMENTS

JP 05-160429 6/1993

(Continued)

OTHER PUBLICATIONS

Murakami et al., "$In_xGa_{1-x}As/InAs_yP_{1-y}$ detector for near infrared(1-2.6 μm)", Conference Proceedings of Indium Phosphide and Related Materials, pp. 528-531.

(Continued)

*Primary Examiner* — Fernando L Toledo
*Assistant Examiner* — Robert Carpenter
(74) *Attorney, Agent, or Firm* — Venable LLP; Michael A. Sartori; Steven J. Schwarz

(57) ABSTRACT

A light-receiving element device capable of receiving near infrared to mid-infrared light of 1.7 μm-3.5 μm is provided. A substrate is formed of InP, and a superlattice light-receiving layer is formed of a superlattice of a type 2 junction formed by alternately being stacked a falling layer of a Group III-V compound semiconductor including In, Ga, As, N and a rising layer of a Group III-V compound semiconductor including Ga, As, Sb. The film thickness of the falling layer and the rising layer is each 3 nm-10 nm. The entire thickness of the superlattice light-receiving layer is 2 μm-7 μm. The lattice mismatch of the constituent film of the superlattice light-receiving layer to InP is ±0.2% or less.

10 Claims, 15 Drawing Sheets p-ELECTRODE 9
ANTIREFLECTION FILM 8 (SiON)
$p^+$-InP WINDOW LAYER 7
InGaAsN/GaAsSbN
4
$n^+$-InP BUFFER LAYER 3
$n^+$-InP SUBSTRATE 2
n-ELECTRODE 10

U.S. PATENT DOCUMENTS

| | | | | |
|---|---|---|---|---|
| 2005/0129078 | A1 * | 6/2005 | Johnson | 372/50 |
| 2005/0142683 | A1 * | 6/2005 | Johnson et al. | 438/47 |
| 2006/0065952 | A1 * | 3/2006 | Boos et al. | 257/565 |
| 2007/0264835 | A1 | 11/2007 | Iguchi et al. | |

FOREIGN PATENT DOCUMENTS

| | | |
|---|---|---|
| JP | 06-196745 | 7/1994 |
| JP | 09-219563 | 8/1997 |
| JP | 2003-142783 | 5/2003 |
| JP | 2003-282927 | 10/2003 |
| JP | 2005-260118 | 9/2005 |
| JP | 2006-270060 | 10/2006 |
| JP | 2007-324572 | 12/2007 |

OTHER PUBLICATIONS

Sidhu et al., "A long-wavelength photodiode on InP using lattice-matched GaInAs-GaAsSb type-II quantum wells", IEEE Photonics Technology Letters, vol. 17, No. 12, pp. 2715-2717, Dec. 2005.

Yamamoto et al., "Optical properties of $GaAs_{0.5}Sb_{0.5}$ and $In_{0.53}Ga_{0.47}As/GaAs_{0.5}Sb_{0.5}$ type II single hetero-structures lattice-matched to InP substrates grown by molecular beam epitaxy", Journal of Crystal Growth, vol. 201/202, pp. 872-876, May 1999.

Klem et al., "Growth and properties of GaAsSb/InGaAs superlattices on InP", Journal of Crystal Growth, vol. 111, pp. 628-632, 1991.

Sai-Halasz et al., "Optical Absorption of $In_{i-x}Ga_xAs$-$GaSb_{i-y}As_y$ Superlattices", Solid State Communications, vol. 27, pp. 935-937, 1978.

Sugiyama et al., "Conduction-band edge discontinuity of InGaAs/GaAsSb heterostructures lattice-matched to InP grown by molecular beam epitaxy", Journal of Crystal Growth, vol. 95, pp. 363-366, 1989.

* cited by examiner

GaAsSb Q= 430 meV
InGaAs

FIG.12

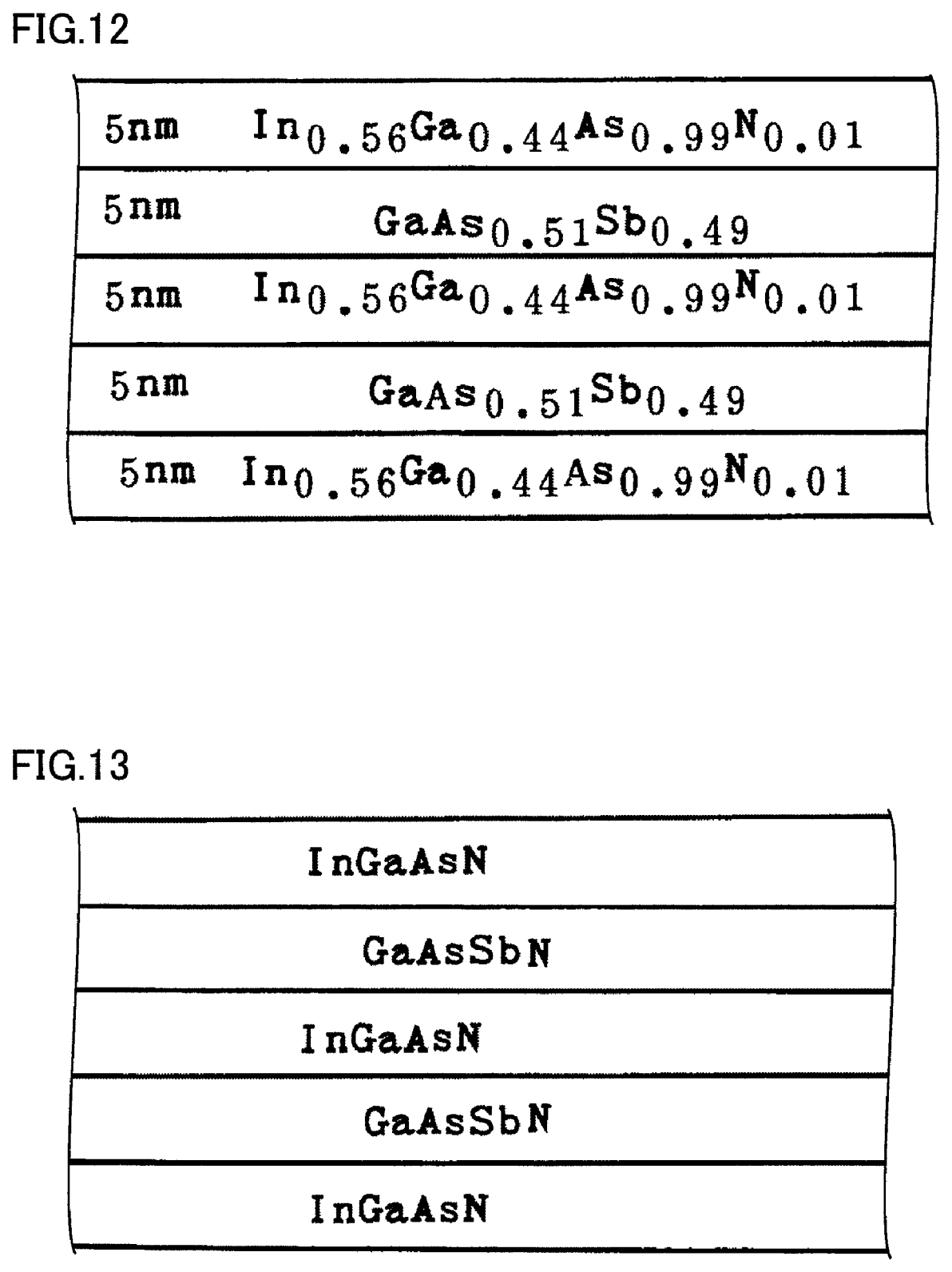

| 5nm | $In_{0.56}Ga_{0.44}As_{0.99}N_{0.01}$ |
|---|---|
| 5nm | $GaAs_{0.51}Sb_{0.49}$ |
| 5nm | $In_{0.56}Ga_{0.44}As_{0.99}N_{0.01}$ |
| 5nm | $GaAs_{0.51}Sb_{0.49}$ |
| 5nm | $In_{0.56}Ga_{0.44}As_{0.99}N_{0.01}$ |

FIG.13

| InGaAsN |
|---|
| GaAsSbN |
| InGaAsN |
| GaAsSbN |
| InGaAsN |

FIG.14

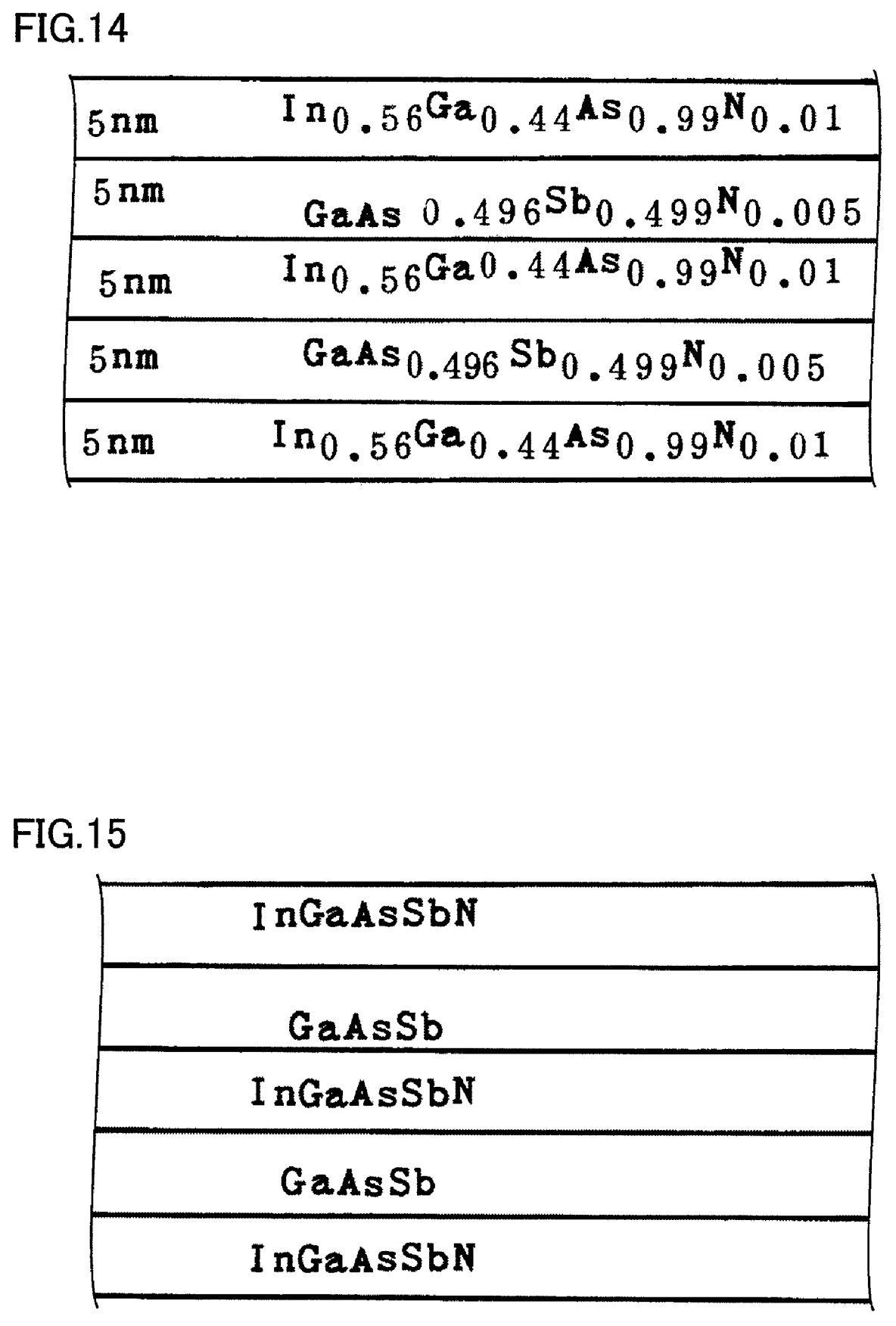

| | |
|---|---|
| 5nm | $In_{0.56}Ga_{0.44}As_{0.99}N_{0.01}$ |
| 5nm | $GaAs_{0.496}Sb_{0.499}N_{0.005}$ |
| 5nm | $In_{0.56}Ga_{0.44}As_{0.99}N_{0.01}$ |
| 5nm | $GaAs_{0.496}Sb_{0.499}N_{0.005}$ |
| 5nm | $In_{0.56}Ga_{0.44}As_{0.99}N_{0.01}$ |

FIG.15

| |
|---|
| InGaAsSbN |
| GaAsSb |
| InGaAsSbN |
| GaAsSb |
| InGaAsSbN |

FIG.16

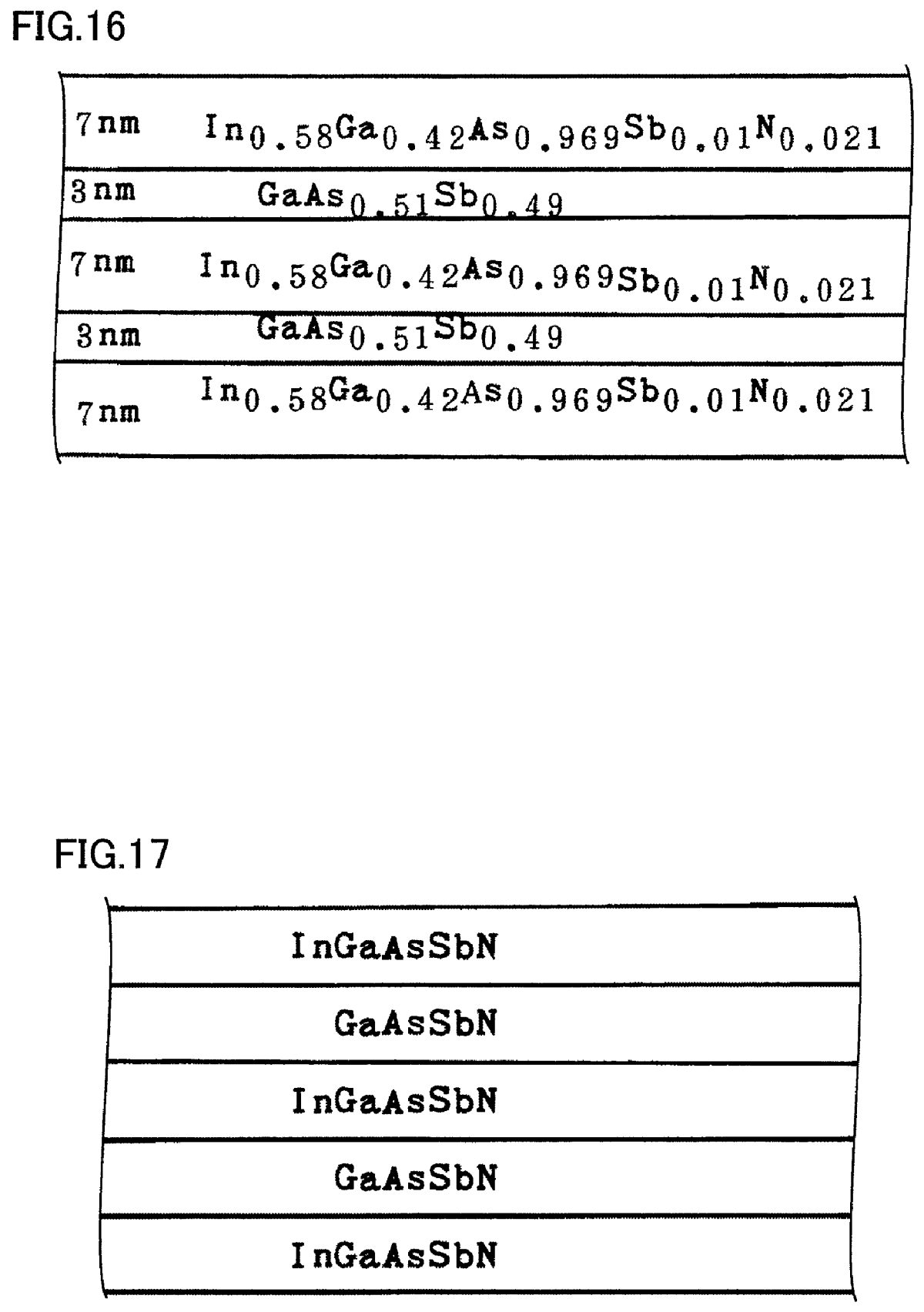

| | |
|---|---|
| 7nm | $In_{0.58}Ga_{0.42}As_{0.969}Sb_{0.01}N_{0.021}$ |
| 3nm | $GaAs_{0.51}Sb_{0.49}$ |
| 7nm | $In_{0.58}Ga_{0.42}As_{0.969}Sb_{0.01}N_{0.021}$ |
| 3nm | $GaAs_{0.51}Sb_{0.49}$ |
| 7nm | $In_{0.58}Ga_{0.42}As_{0.969}Sb_{0.01}N_{0.021}$ |

FIG.17

| |
|---|
| InGaAsSbN |
| GaAsSbN |
| InGaAsSbN |
| GaAsSbN |
| InGaAsSbN |

FIG.18

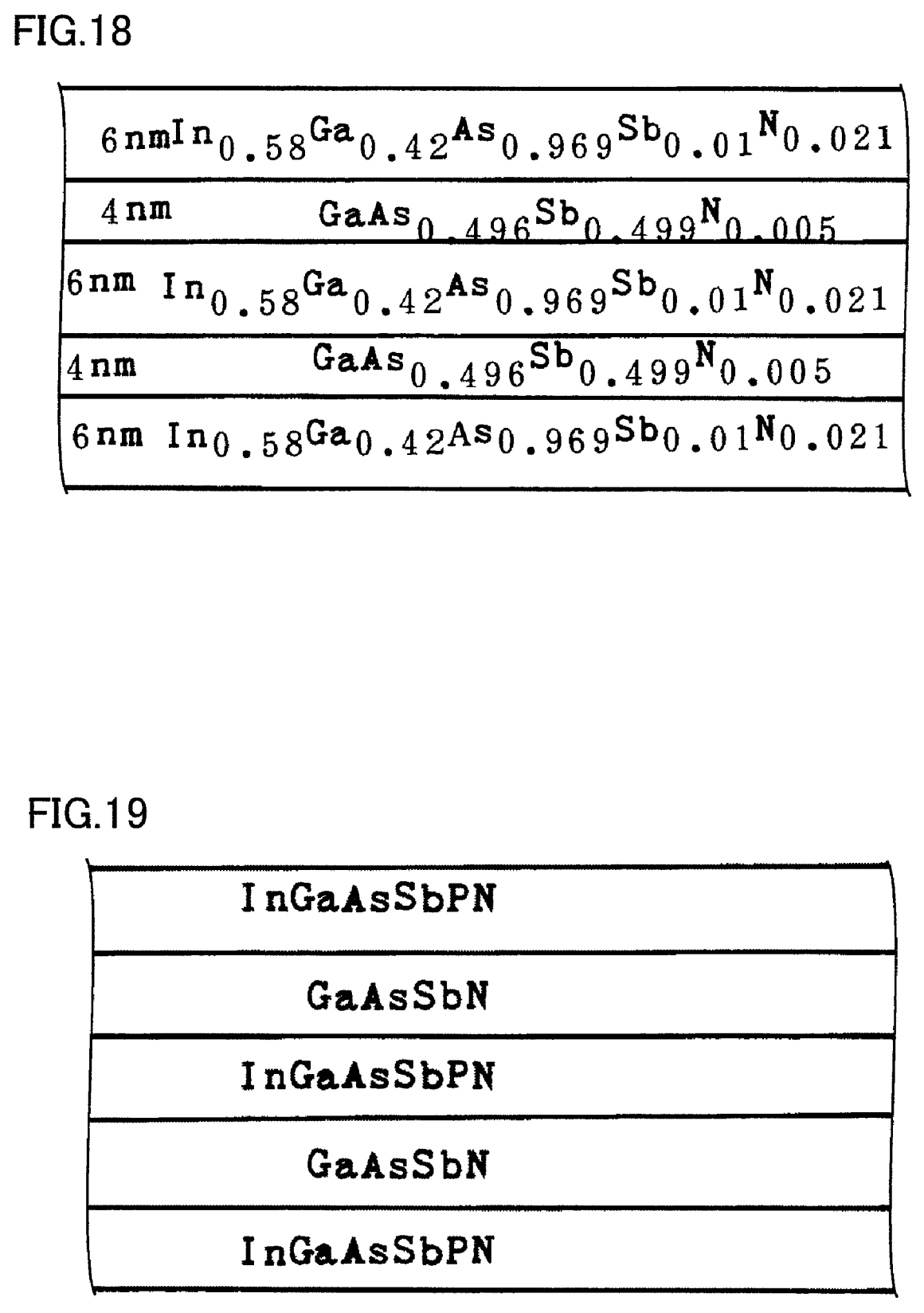

| |
|---|
| 6nm $In_{0.58}Ga_{0.42}As_{0.969}Sb_{0.01}N_{0.021}$ |
| 4nm $GaAs_{0.496}Sb_{0.499}N_{0.005}$ |
| 6nm $In_{0.58}Ga_{0.42}As_{0.969}Sb_{0.01}N_{0.021}$ |
| 4nm $GaAs_{0.496}Sb_{0.499}N_{0.005}$ |
| 6nm $In_{0.58}Ga_{0.42}As_{0.969}Sb_{0.01}N_{0.021}$ |

FIG.19

| |
|---|
| InGaAsSbPN |
| GaAsSbN |
| InGaAsSbPN |
| GaAsSbN |
| InGaAsSbPN |

FIG.20

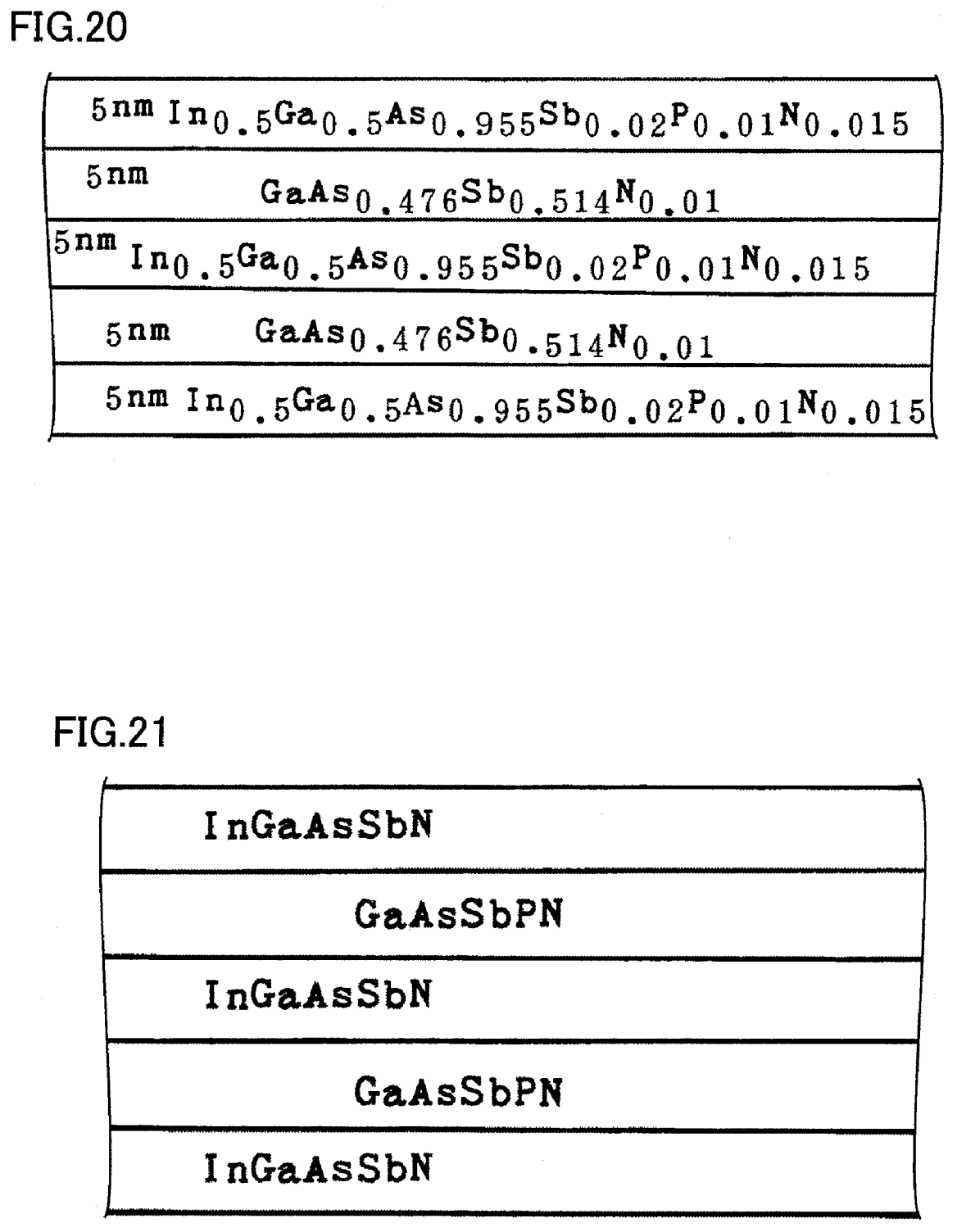

| |
|---|
| 5nm $In_{0.5}Ga_{0.5}As_{0.955}Sb_{0.02}P_{0.01}N_{0.015}$ |
| 5nm $GaAs_{0.476}Sb_{0.514}N_{0.01}$ |
| 5nm $In_{0.5}Ga_{0.5}As_{0.955}Sb_{0.02}P_{0.01}N_{0.015}$ |
| 5nm $GaAs_{0.476}Sb_{0.514}N_{0.01}$ |
| 5nm $In_{0.5}Ga_{0.5}As_{0.955}Sb_{0.02}P_{0.01}N_{0.015}$ |

FIG.21

| |
|---|
| InGaAsSbN |
| GaAsSbPN |
| InGaAsSbN |
| GaAsSbPN |
| InGaAsSbN |

| | |
|---|---|
| 5nm | $In_{0.55}Ga_{0.45}As_{0.98}Sb_{0.01}N_{0.01}$ |
| 5nm | $GaAs_{0.338}Sb_{0.642}P_{0.01}N_{0.01}$ |
| 5nm | $In_{0.55}Ga_{0.45}As_{0.98}Sb_{0.01}N_{0.01}$ |
| 5nm | $GaAs_{0.338}Sb_{0.642}P_{0.01}N_{0.01}$ |
| 5nm | $In_{0.55}Ga_{0.45}As_{0.98}Sb_{0.01}N_{0.01}$ |

LIGHT-RECEIVING DEVICE

TECHNICAL FIELD

The present invention relates to a light-receiving device using a Group III-V compound semiconductor for use in sensors, image pickup devices and the like having sensitivity in the near infrared region to the mid-infrared region. More specifically, it is aimed to provide a device capable of receiving infrared light of 2 μm-3 μm.

BACKGROUND ART

A variety of applications of such mid-infrared light are expected in the fields of gas analysis, medical care, environmental measurement, and the like. However, they have not been realized since there exist no semiconductor light-emitting devices emitting infrared light in this range. In the present situation, not only light-emitting devices but also any appropriate light-receiving devices do not exist. A photodiode for optical communication has an InP (indium phosphide) substrate and an InGaAs (indium gallium arsenide) light-receiving layer and is sensible to 1.3 μm-1.6 μm near infrared light.

However, there is no appropriate material having an absorption edge of 1.6 μm or longer, so that it is impossible to fabricate a device receiving infrared light of 1.6 μm or longer. FIG. 4 schematically depicts a band structure formed in a semiconductor bulk crystal and shows a valence band and a conduction band of a light-receiving layer. The valence band and the conduction band extend uniformly. A forbidden layer lies therebetween. The energy width of the forbidden band, that is, the difference of energy (energy level) between the valence band and the conduction band is band gap Eg. The light-receiving layer absorbs light thereby exciting an electron in the valence band to the conduction band. If a pn junction is fabricated with an absorptive material, the excited electrons, holes are separated to form photocurrent, which is taken out to the outside. A photodiode which senses incidence of light is thus structured.

However, only light having energy of band gap Eg or greater is absorbed by semiconductor. Energy of light is given by $h\nu=hc/\lambda$. Here, h is Planck's constant, c is the speed of light in vacuum, λ is wavelength, and ν is frequency. When energy of light $E=hc/\lambda$ is expressed by eV and wavelength λ, is expressed by μm, the relation of $\lambda=1.2398/E$ holds. The band gap energy of the substrate InP is 1.3 eV, and thus the cutoff wavelength is 0.95 μm. The InP substrate absorbs light with the shorter wavelength. Since light with the longer wavelength is allowed to pass through, the substrate can be used for a device measuring light of 0.95 μm or longer. A thin film of Group III-V matched to the InP substrate can be formed thereon thereby to fabricate a light-receiving device.

However, the lattice-matching to the substrate is required as a condition. Ternary InGaAs is often used as a light-receiving layer. Under the condition of matching to InP, a composition of $In_{0.53}Ga_{0.47}As$ is used. This has an absorption edge wavelength of about 1.6 μm. Therefore, it is suited for a photodiode receiving light for optical communication, such as 1.3 μm or 1.55 μm.

However, there is no appropriate photodiode capable of receiving light of the longer wavelength, 2 μm-3 μm. In order to receive 2.5 μm, the band gap energy has to be approximately Eg=0.5 eV, However, there are few appropriate semiconductors having such a narrow band gap, and if any, it is impossible to fabricate a pn junction to form a photodiode.

Japanese Patent Laying-Open No. 09-219563 (Patent Document 1) proposes Group III-V semiconductor including Sb (antimony) as a laser material adapted to mid-infrared light, but it states that Group III-V crystal including Sb is difficult to form and is too unstable to fabricate a practical device. Japanese Patent Laying-Open No. 09-219563, which denies Sb-based Group III-V, insists that Group III-V compound semiconductor including nitrogen, such as GaInNAs (gallium indium nitride arsenide) or InNPAs (indium nitride phosphide arsenide), matched to a GaAs substrate or an InP substrate may be a crystal having a band gap energy of 0.73 eV or less and it is possible to form a light-emitting device emitting mid-infrared light of 1.7 μm-5 μm and a light-receiving device receiving with such a wavelength range. Energy of 0.73 eV corresponds to a wavelength of 1.7 μm. Japanese Patent Laying-Open No. 09-219563 insists that since the electronegativity of nitrogen is extremely high, as the lattice constant decreases, the band gap also decreases, as long as the nitrogen proportion is small.

On the other hand, GaInAs (gallium indium arsenide) which has been used in optical communication is characterized in that as the lattice constant increases, the band gap decreases. Thus, GaInNAs which is made of GaInAs with the addition of nitrogen can have a bandgap decreased with the lattice constant matched to the InP or GaAs (gallium arsenide) substrate, so that it is possible to fabricate a mixed crystal having a band gap energy of 0.73 eV or less.

Japanese Patent Laying-Open No. 09-219563 describes a structure of a semiconductor laser with emphasis on a light-emitting device. A description of a photodiode is only made in Example 1. The photodiode structure in Example 1 in Japanese Patent Laying-Open No. 09-219563 is illustrated as follows, from the top in order.

p-GaInAs cap layer (0.2 μm thick)

p-InP layer (1.0 μm thick)

non-doped GaInNAs strain-free light absorption layer (0.5 μm thick)

n-InP layer (1.0 μm thick)

n-InP substrate

Japanese Patent Laying-Open No. 09-219563, however, does not mention the mixed crystal ratio of the GaInNAs strain-free light absorption layer. The value of the band gap of the GaInNAs strain-free light absorption layer is unknown. Moreover, no mention is made of whether it can receive light of 1.7 μm or not. The request for examination was not made for Japanese Patent Laying-Open No. 09-219563 and the application is deemed to be withdrawn. In order to lower the band gap energy to 0.6 eV (corresponding to wavelength 2 μm), the proportion of nitrogen N has to be made considerably large (about 10%). However, it is impossible to grow a GaInNAs thin film having such a high nitrogen proportion on the InP substrate. Group V element has an extremely high vapor pressure at a growth temperature, which makes vapor deposition difficult. In addition, in this case, two different Group V elements exist. The vapor pressures are considerably different, and successful growth is impossible even with MBE (Molecular Beam Epitaxy).

Japanese Patent Laying-Open No. 2003-282927 (Patent Document 2) proposes a photodiode in which an $In_{0.53}Ga_{0.47}As$ layer having a lattice constant smaller than that of InP and an $In_{0.55}Ga_{0.45}As$ layer having a lattice constant larger than that of InP are grown in an overlapping manner as light-receiving layers on an InP substrate, and an InP cap layer is grown thereon. Two layers each having a lattice constant greater or smaller than that of InP are combined so that the average lattice constant agrees with the lattice constant of InP. The absorption wavelength of the former $In_{0.53}Ga_{0.47}As$ is $\lambda g=1.57$ μm, and the absorption edge wavelength of the latter $In_{0.55}Ga_{0.45}As$ is 4=1.63 μm.

Therefore, infrared light of up to 1.63 μm can be received. As the conventional photodiode for optical communication has an $In_{0.53}Ga_{0.47}As$ light-receiving layer with the absorption wavelength of $\lambda g$=1.57 μm, light can be sensed to the infrared side by 0.06 μm as compared with the conventional one.

However, a semiconductor lattice-matched to InP or GaAs and having a narrow band gap hardly exists. Then, two types of structure having a superlattice as a light-receiving layer have been proposed. It is known that there are two different kinds of junctions of a mixed crystal semiconductor thin film layer matched to an InP substrate. The normal one is called type 1 and a newly discovered junction is called type 2. The difference in manner of these two kinds of junctions will be described.

FIG. 5 shows a band of a superlattice structure of type 1. When a heterojunction is formed between a material A having a narrow bandgap $Eg_A$ and a material B having a wide band gap $Eg_B$, conduction band $C_B$ of B lies above conduction band $C_A$ of A, and valence band $V_B$ of B lies below valence band $V_A$ of A. This is referred to as a type 1 heterojunction.

Although band gap $Eg_A$ of material A and band gap $Eg_B$ of material B are determined, the amounts of the conduction band difference ($C_A-C_B$) and the valence band difference ($V_A-V_B$) in the junction are not easily known. This may be a difference of work function $\phi$, which is not known in advance. It is not determined until a sample is prepared. The heights of the conduction band and the valence band of material A are given by $C_A$, $V_A$, respectively. The heights of the conduction band and the valence band of material B are given by $C_B$, $V_B$, respectively.

$$C_A-V_A=Eg_A \quad (1)$$

$$C_B-V_B=Eg_B \quad (2)$$

where $Eg_A$, $Eg_B$ are constants. If $C_A-C_B$ or $V_A-V_B$ is known, all of $C_A$, $V_A$, $C_B$, $V_B$ are determined. However, neither $C_A-C_B$ nor $V_A-V_B$ is easily known, and the manner of the band created with the heterojunction of material A and material B is not known in advance. This is because $C_A-C_B$ is not determined until the heterojunction is fabricated. However, even if $C_A-C_B$ is determined, the means for finding the values of $C_A$, $V_A$, $C_R$, $V_B$ is limited. There is no means for directly detecting how the junction is formed.

In a type 1 heterojunction, when $Eg_A<Eg_B$, $C_A-C_B<0$ and $V_A-V_B>0$. In general, $(C_A-C_B)(V_A-V_B)<0$ can be defined. The difference of conduction band heights and the difference of valence band heights are opposite. In the normal heterojunction, when a valence band goes down, a conduction band goes up, and such a relation is the most common.

In a superlattice structure having materials A, B repeatedly laid in layers as well as in a single heterojunction, the relation of bands is the same. The single junction of type 1 is as shown in FIG. 5. An example of $Eg_A<Eg_B$ is shown. $C_B>C_A$, $V_A>V_B$. The conduction band difference $W_{AB}=C_A-C_B$ is negative. The valence band difference $U_{AB}=V_A-V_B$ is positive. In type 1, such a simple expression as $W_{AB}U_{AB}<0$ can be made. A number of type 1 junctions are alternately laid as shown in FIG. 9.

Absorption of light with a long wavelength in material A causes transition as shown by p, creating an electron-hole pair in material A. Absorption of light with a short wavelength in material B causes transition as shown by q, creating an electron-hole pair in material B. This depends on a wavelength (energy) of light to be absorbed. Transition which goes across the junction as shown by r occurs with a low probability. When monochrome light with low energy is applied, only transition of p occurs. Given that $hc/\lambda$ is photon energy, light with a wavelength $\lambda$, longer than $hc/Eg_A$ is not absorbed. A photodiode having a superlattice including this multi junction as a light-receiving layer cannot detect light with energy smaller than narrow band gap $Eg_A$.

For example, when a superlattice of InGaAs/InP is fabricated, a type 1 junction is fabricated in which InP corresponds to material B having a wide band gap and InGaAs corresponds to material A having a narrow band gap. Type 1 is the normal junction. The junction of most semiconductors is type 1. For detection of infrared light having a long wavelength, there is no other choice but to use a semiconductor material having a narrow band gap. However, a semiconductor having such a narrow band gap hardly exists.

However, the junction as shown in FIG. 6 may be contemplated. In the heterojunction between material D and material G, conduction band bottom energy $C_D$, $C_G$ and valence band peak energy $V_D$, $V_G$ change similarly. In other words, in this junction, $W_{GD}=C_D-C_G>0$, $U_{GD}=V_D-V_G>0$ or vice versa. In general, $(C_D-C_G)(V_D-V_G)>0$.

In Non-Patent Document 4 (Klem et al.), a superlattice thin film structure having a heterojunction of $GaAs_{0.5}Sb_{0.5}/In_{0.53}Ga_{0.47}As$ was formed on an InP substrate by MBE, and with various combinations of film thicknesses of the superlattice, photoluminescence (PL) of the GaAsSb/InGaAs superlattice structure at 77 K was examined. The angle dependency of (004) X-ray diffraction intensity was also measured. The appropriate mixed crystal ratio is determined by the condition of lattice match since the structure was formed on an InP substrate.

The mixed crystal ratio of InGaAs is In=0.53, Ga=0.47, as repeatedly described so far, which is most commonly used as a light-receiving layer on the InP substrate. This light-receiving layer is that of the photodiode for optical communication with 1.2 μm-1.6 μm, which has already been used widely. The band gap energy is Eg=789 meV and the absorption edge wavelength is 1.57 μm. Photoluminescence corresponding to band-to-band transition 1.57 μm appears.

The other GaAsSb is a material difficult to prepare. The growth speed of GaAsSb is slow. The mixed crystal ratio of GaAsSb is unstable. When GaAsSb is manufactured, the mixed crystal ratio varies widely depending on the composition or temperature of the material gas.

The band gap $W_{GD}$, $U_{GD}$ in the GaAsSb/InGaAs junction is also unknown. With three kinds of combinations of superlattice film thicknesses of 16.5 nm/16.5 nm, 8.5 nm/8.5 nm, 5.5 nm/5.5 nm, photoluminescence at 10 K was measured. The result was that photoluminescence had a peak of 0.45 eV, 0.48 eV, 0.53 eV, respectively, and the photoluminescence intensity was greater in the combination of a thinner superlattice film thickness.

If this is a type 2 junction and photoluminescence is generated by transition between the conduction band of InGaAs and the valence band of GaAsSb, given that the energy difference between the bottom of the InGaAs conduction band and the peak of the GaAsSb valence band is Q, energy Eph of the photoluminescence should be:

$$Eph=Q+(h^2/8)(1/t^2m_e+1/s^2m_h)$$

where h is Planck's constant, s, t are the thicknesses of one rising layer, one falling layer, respectively, and $m_e$, $m_h$ are the effective mass of electron hole. With Q and s, t varied, possible values of Eph can be calculated. With s=t=16.5 nm, 8.5 nm, 5.5 nm, the respective three kinds of superlattices were formed, and the measured photoluminescence was Eph=0.45, 0.49, 0.54 eV, respectively. Based on the measurement results, Non-Patent Document 4 estimated that the intersection band gap energy Q=0.43 eV. Non-Patent Document 4 estimated that the band gap energy of GaAsSb (As:Sb=50:50) was $Eg_D$=800 meV and the band gap energy of InGaAs was $Eg_G$=810 meV.

As shown in FIG. 6, since $Eg_G=Q+U_{GD}$, $Eg_D=W_{GD}+Q$, it can be calculated that $U_{GD}$=380 meV, $W_{GD}$=370 meV. The offset $W_{GD}$ of the conduction band is finally calculated here. $W_{GD}$ is the most important parameter of the type 2 junction. When this is determined, the intersection band gap is also found, for the band gap is known. Non-Patent Document 4 insists that Q=430 meV.

Non-Patent Document 4 assumed the intersection band gap energy $C_D-C_G$=0.37 eV. The rising layer is D=GaAsSb, and the falling layer is G=InGaAs. Although the mixed crystal ratio of GaAsSb varies depending on the material gas Group V/Group III ratio, when 5.5, it is calculated that the absorption edge is 1.55 μm and the band gap energy $Eg_D$=0.800 eV. On the hand, InGaAs is a well-known mixed crystal with In of 53% and Ga of 47%. The absorption edge wavelength is 1.57 μm and the band gap energy is $Eg_G$=0.789 eV. On the assumption of $C_D-C_G$=0.37 eV, the gap of the valence band should be $V_D-V_G$=0.359 eV. FIG. 7 is a band junction diagram based on such an assumption. Non-Patent Document 4 estimates such a band diagram based on the measurement of photoluminescence.

However, different values of intersection band gap Q have been reported until then. Non-Patent Document 5 mentions the intersection band gap energy Q=230 meV. Non-Patent Document 6 says the intersection band gap energy Q=250 meV.

The value of Q varies depending on the target to be measured and the assumption. A number of assumptions have existed for the value of the intersection band gap Q.

This illustrates the unstableness of GaAsSb and the difficulty of evaluation. Even if the band gap $Eg_G$, $Eg_D$ unique to a material cannot be made small, if the intersection band gap is small, this intersection transition leads to a possibility of fabricating a photodiode capable of receiving infrared light with a long wavelength.

The type 2 junction is complicated and the terms are thus defined provisionally here. In the type 2 junction, the layer in which both a conduction band and a valence band become high is called a rising layer D. A layer in which both a conduction band and a valence band become low is called a falling layer G. $W_{GD}$ is referred to as a conduction band offset. $U_{GD}$ is referred to as a valence band offset. The relation $Eg_G=Q+U_{GD}$, $Eg_D=W_{GD}+Q$ holds between the band gap $Eg_G$ of the falling layer, the band gap $Eg_D$ of the rising layer and the conduction band offset, the valence band offset. Q is the degree of energy of mid-infrared light (2-3 μm).

Photoluminescence corresponding to Q is generated. It is assumed that this is due to electron transition between the conduction band of the falling layer and the valence band of the rising layer. The generated photoluminescence may be used to form a light-emitting device for mid-infrared. An attempt has been made to fabricate a light-emitting device for mid-infrared using the GaAsSb/InGaAs junction. By contrast, the generation of photoluminescence leads to the expectation that a light-receiving device absorbing mid-infrared light to generate photocurrent may be formed. In other words, a photodiode for mid-infrared light may possibly be fabricated using the type 2 junction.

In Non-Patent Document 3 (Yamamoto et al.), $In_{0.53}Ga_{0.47}As/GaAs_{0.5}Sb_{0.5}$ single junction (SH; single-hetero: not MQW) was grown on an InP substrate by MBE with the temperature varied (505° C., 515° C., 530° C.) and with the Group VIII ratio varied (the Group VIII ratio=5.5, 12, 18), and with application of Ar (argon) laser (514 nm), the growth temperature dependency of photoluminescence was examined. Here, photoluminescence is approximately from 1.5 μm to 1.63 μm and is not the photoluminescence (2.3 μm) resulting from the intersection band gap.

In addition to photoluminescence corresponding to the band-edge wavelength of 1.57 μm, photoluminescence having a peak at the lower energy 1.61 μm appeared in the GaAsSb layer grown with the material gas Group V/III ratio of 5.5. When the growth temperature is increased from 505° C. to 530° C., the peak of 1.61 μm decreases. It was mentioned that emission of 1.61 μm could not be detected in a sample with the growth temperature of 530° C. This does not correspond to either the band gap of InGaAs or the band gap of GaAsSb. This may be emission resulting from impurity interlevel transition. In Non-Patent Document 3, the conduction band energy difference is assumed to be $W_{GD}$=370 meV, and assuming a potential in InGaAs (falling layer G), a Schrödinger equation is formulated and solved self-consistently.

The first orbital energy of the conduction band of the falling layer $In_{0.53}Ga_{0.47}As$ is $E_1$=124 meV, the second orbital energy is $E_2$=150 meV, and Fermi energy is $E_f$=176 meV. This is shown in FIG. 8. Although the first orbital and second orbital energy of the valence band of the rising layer is not calculated, it is believed that $E_1$=50 meV, approximately.

Since the energy difference between the bottom of the conduction band of the falling layer and the peak of the valence band of the rising layer is Q=370 meV, the energy released to the peak of the rising layer (GaAsSb) by an electron dropping from the first orbit of the conduction band of the falling layer to the first orbit of the valence band of the rising layer is 544 meV. This corresponds to a wavelength 2.46 μm. It is assumed that this is the source of photoluminescence of 2.4 μm-2.5 μm. In other words, $Q=W_{GD}$=370 meV was confirmed, according to Non-Patent Document 3.

Non-Patent Document 2 (Rubin et al.) proposes a photodiode in which an $In_{0.53}Ga_{0.47}As$ buffer layer is formed on an InP substrate, a quantum well (total thickness of 1500 nm) of 150 pairs of InGaAs/GaAsSb of 5 nm/5 nm is grown thereon, and in addition, $In_{0.53}Ga_{0.47}As$ window layer is provided. It says that light of 2.23 μm was received at room temperature. This is the first photodiode using the type 2 junction.

Patent Document 1: Japanese Patent Laying-Open No. 09-219563

Patent Document 2: Japanese Patent Laying-Open No. 2003-282927

Non-Patent Document 1: T. Murakami et al., "$In_xGa_{1-x}As/InAs_yP_{1-y}$ detector for near infrared (1-2.6 μm)," Conference Proceedings of Indium Phosphide and Related Materials Non-Patent Document 2: Rubin Sidhu, Ning Duan, Joe C. Cambell & Archie L. Holmes, "A Long-Wavelength Photodiode on InP Using Lattice-Matched GaInAs—GaAsSb Type-II Quantum Wells," IEEE Photonics Technology Letters, Vol. 17, No. 12, pp 2715-2717, December 2005

Non-Patent Document 3: A. Yamamoto, Y. Kawamura, H. Naito & N. Inoue, "Optical properties of $GaAs_{0.5}Sb_{0.5}$ and $In_{0.53}Ga_{0.47}As/GaAs_{0.5}Sb_{0.5}$ type II single hetero-structures lattice-matched to InP substrates grown by molecular beam epitaxy," Journal of Crystal Growth, Vol. 201/202, pp 872-876, May 1999

Non-Patent Document 4: J. F. Klem, S. R. Kurtz and A. Datye, "Growth and properties of GaAsSb/InGaAs superlattices on InP," Journal of Crystal Growth vol. 111, pp 628-632, 1991

Non-Patent Document 5: G. A. Sai-Halasz et al., Solid State Commun. 27, p 935, 1978

Non-Patent Document 6: Y. Sugiyama et al., Journal of Crystal Growth vol. 95, p 363, 1989

DISCLOSURE OF THE INVENTION

Problems to be Solved by the Invention

It is aimed to provide a light-receiving device having sensitivity for mid-infrared light longer than 1.7 μm and up to about 3.5 μm.

Means for Solving the Problems

The present invention provides a light-receiving element, a light-receiving device capable of receiving mid-infrared light of low energy, in which a superlattice light-receiving layer having a type 2 junction is formed by being stacked a plurality of junctions each made of a falling layer in which both of a valence band and a conduction band are low in energy level and a rising layer in which both of a valence band and a conduction band become high in energy level, so that a band gap transition between layers occurs. Formation on an InP substrate imposes the condition that the falling layer and the rising layer should be lattice-matched to an InP substrate.

The falling layer (G-type layer) in which a valence band and a conduction band are low in energy level is a Group III-V compound semiconductor at least including In, Ga, As, N, specifically, InGaAsN, InGaAsSbN, InGaAsSbPN matched to the InP substrate.

The rising layer (D-type layer) in which a valence band and a conduction band are high in energy level is a Group III-V compound semiconductor at least including Ga, As, Sb, specifically, GaAsSb, GaAsSbN, GaAsSbPN matched to InP.

The falling layer (G) and the rising layer (D) are, for example,

G=InGaAsN, InGaAsSbN, InGaAsSbPN

D=GaAsSb, GaAsSbN, GaAsSbPN, and therefore, combination examples are as follows.

[G/D Combination Examples]

[1. InGaAsN/GaAsSb (FIG. 11)]

[2. InGaAsN/GaAsSbN (FIG. 13)]

[3. InGaAsSbN/GaAsSb (FIG. 15)]

[4. InGaAsSbN/GaAsSbN (FIG. 17)]

[5. InGaAsSbPN/GaAsSbN (FIG. 19)]

[6. InGaAsSbN/GaAsSbPN (FIG. 21)]

[7. InGaAsN/GaAsSbPN]

[8. InGaAsSbPN/GaAsSbPN]

[9. InGaAsSbPN/GaAsSb]

Although the mixed crystal ratios are omitted here, the condition of matching to InP dictates the mixed crystal ratios. Specific mixed crystal ratios will be described later.

The conditions of lattice matching to the InP substrate are strict, and when a difference in lattice constant from InP is Δa and the lattice constant of InP is a, $-0.002 \leqq \Delta a/a < +0.002$.

In other words, the lattice mismatch to the InP substrate is ±0.2% or less. Outside this, dark current becomes high.

The thickness t of the falling layer and the thickness s of the rising layer, which are components of the superlattice (multiquantumwell) light-receiving layer, may be equal or may not be equal, but in any case, each is, for example, 3 nm-10 nm. For example, the superlattice structure may be formed of the falling layer/the rising layer=3 nm/3 nm, 5 nm/5 nm, 7 nm/7 nm, 10 nm/10 nm. Rather than the same thicknesses, the unequal thicknesses may be employed, such as the falling layer/the rising layer=5 nm/3 nm or the falling layer/the rising layer 3 nm/6 nm.

When the thickness of the superlattice light-receiving layer is narrow, the energy separation between quantized level of electron created in the conduction band and quantized level of hole created in the valence band are increased. Addition of Q to energy of both quantized levels gives the absorption edge of photon. If narrower than 3 nm, the quantized level becomes high and the photon absorption edge energy is increased, so that the sensitivity in from infrared to mid-infrared (1.7 μm-3.5 μm) is lost. Therefore, 3 nm or wider is set.

On the contrary, if the thickness of the superlattice is wider than 10 nm, intersection occurs and electron-hole pairs are hardly created. In other words, the sensitivity as a photodiode is decreased. The characteristic of type 2 junction is not utilized. Therefore, thickness t of the falling layer and thickness s of the rising layer constituting the superlattice light-receiving layer are determined as $3\ \text{nm} \leqq s, t \leqq 10\ \text{nm}$.

The entire thickness L of the superlattice light-receiving layer is found by multiplying the sum (s+t) of the respective individual thicknesses t and s by the number of layers M, namely, L=M(s+t). As the superlattice light-receiving layer is a light-receiving portion, the thickness of the superlattice light-receiving layer dictates the sensitivity of the light-receiving element (light-receiving device). If too thin, the sensitivity is low. The lower limit is 2 μm. If less than this, the sensitivity is too low. On the contrary, if the thickness of the superlattice light-receiving layer is increased, the cost is increased and the strains are increased. What is required is that the incident light is absorbed entirely. The thickness that allows the incident light to be entirely absorbed depends on the composition. The upper limit of thickness L of the superlattice light-receiving layer is about 7 μm. Therefore, thickness L of the superlattice light-receiving layer is preferably $2\ \mu\text{m} \leqq L \leqq 7\ \mu\text{m}$.

If the outermost surface is terminated with InGaAs(N), current leak occurs and dark current increases. Furthermore, when the outermost surface is formed of GaAsSb, it is difficult to form a passivation film, for the technique of forming a passivation film for Sb has not been established as of now. On the other hand, since InP has a band gap greater than that of the superlattice light-receiving layer, it serves as a barrier layer to block an electron or hole flow. Therefore, providing of an InP window layer allows leak current to be blocked and reduces dark current. In addition, unlike Sb, the passivation film formation technique for InP is established (in actual, an SiN film is used). For such reasons, providing of an InP window layer allows dark current to be reduced thereby improving reliability of the element. Next, the effect of providing an InAlAs (indium aluminum arsenide)+InGaAs layer will be described. InAlAs lattice-matched to InP has a band gap equivalent to InP. Thus, InAlAs has an effect of blocking leak current, similarly to InP. However, because of inclusion of Al, it has the property of being easily oxidized, so the structure having InAlAs exposed on the surface is not preferred. Therefore, InGaAs is capped. The technique of a passivation film for InGaAs is also established (a polyimide-based resin is used).

In total, InP is superior to the "InAlAs+InGaAs" combination structure as a window layer formed on the superlattice light-receiving layer. The superlattice light-receiving layer including N is more excellent in crystallinity when it is grown by MBE than by MOVPE (Metal-Organic Vapor Phase Epitaxy). However, growth of InP by MBE has a problem in productivity. As P (phosphorous) is flammable, phosphorous may burn when an MBE apparatus comes into contact with the air during maintenance of the facility. Therefore, phosphorous is not desired with MBE. By contrast, InAlAs or InGaAs is advantageous in that it can be grown without problems and easily by MBE.

Either front-illuminated or rear-illuminated photodiodes may be fabricated. A photodiode array for mid-infrared may be formed.

EFFECTS OF THE INVENTION

According to the present invention, the superlattice light-receiving layer having a type 2 junction is formed by being stacked a plurality of junctions, each made of the falling layer in which both of a valence band and a conduction band are low in energy level and the rising layer in which both of a valence band and a conduction band are high in energy level, so that a band gap transition between layers occurs, thereby providing a light-receiving element, a light-receiving device capable of receiving near infrared to mid-infrared light of 1.7 μm-3.5 μm.

BRIEF DESCRIPTION OF THE DRAWINGS

FIG. 12 is a cross-sectional view of a light-receiving layer of the photodiode for mid-infrared light in accordance with Example 1 of the present invention in which a superlattice made of a repetition of $In_{0.56}Ga_{0.44}As_{0.99}N_{0.01}/GaAs_{0.51}Sb_{0.49}$ is formed as a light-receiving layer.

FIG. 13 is a cross-sectional view of a light-receiving layer of the photodiode for mid-infrared light in accordance with the present invention in which a superlattice made of a repetition of InGaAsN/GaAsSbN is formed as a light-receiving layer.

FIG. 14 is a cross-sectional view of a light-receiving layer of the photodiode for mid-infrared light in accordance with Example 2 of the present invention in which a superlattice made of a repetition of $In_{0.56}Ga_{0.44}As_{0.99}N_{0.01}/GaAs_{0.496}Sb_{0.499}N_{0.005}$ is formed as a light-receiving layer.

FIG. 15 is a cross-sectional view of a light-receiving layer of the photodiode for mid-infrared light in accordance with the present invention in which a superlattice made of a repetition of InGaAsSbN/GaAsSb is formed as a light-receiving layer.

FIG. 16 is a cross-sectional view of a light-receiving layer of the photodiode for mid-infrared light in accordance with Example 3 of the present invention in which a superlattice made of a repetition of $In_{0.58}Ga_{0.42}As_{0.969}Sb_{0.01}N_{0.021}/GaAs_{0.51}Sb_{0.49}$ is formed as a light-receiving layer.

FIG. 17 is a cross-sectional view of a light-receiving layer of the photodiode for mid-infrared light in accordance with the present invention in which a superlattice made of a repetition of InGaAsSbN/GaAsSbN is formed as a light-receiving layer.

FIG. 18 is a cross-sectional view of a light-receiving layer of the photodiode for mid-infrared light in accordance with Example 4 of the present invention in which a superlattice made of a repetition of $In_{0.58}Ga_{0.42}As_{0.969}Sb_{0.01}N_{0.021}/GaAs_{0.496}Sb_{0.499}N_{0.005}$ is formed as a light-receiving layer.

FIG. 19 is a cross-sectional view of a light-receiving layer of the photodiode for mid-infrared light in accordance with the present invention in which a superlattice made of a repetition of InGaAsSbPN/GaAsSbN is formed as a light-receiving layer.

FIG. 20 is a cross-sectional view of a light-receiving layer of the photodiode for mid-infrared light in accordance with Example 5 of the present invention in which a superlattice made of a repetition of $In_{0.5}Ga_{0.5}As_{0.955}Sb_{0.02}P_{0.01}N_{0.015}/GaAs_{0.476}Sb_{0.514}N_{0.01}$ is formed as a light-receiving layer.

FIG. 21 is a cross-sectional view of a light-receiving layer of the photodiode for mid-infrared light in accordance with the present invention in which a superlattice made of a repetition of InGaAsSbN/GaAsSbPN is formed as a light-receiving layer.

DESCRIPTION OF THE REFERENCE SIGNS

2 $n^+$-InP substrate, 3 $n^+$-InP buffer layer, 4 superlattice light-receiving layer, 7 $p^+$-InP window layer, 8 antireflection film, 9 p-electrode, 10 n-electrode

BEST MODES FOR CARRYING OUT THE INVENTION

Example 1

Example 1 Quantum Well Light-Receiving Layer of InGaAsN/GaAsSb (FIG. 12)

Figures 22, 23:
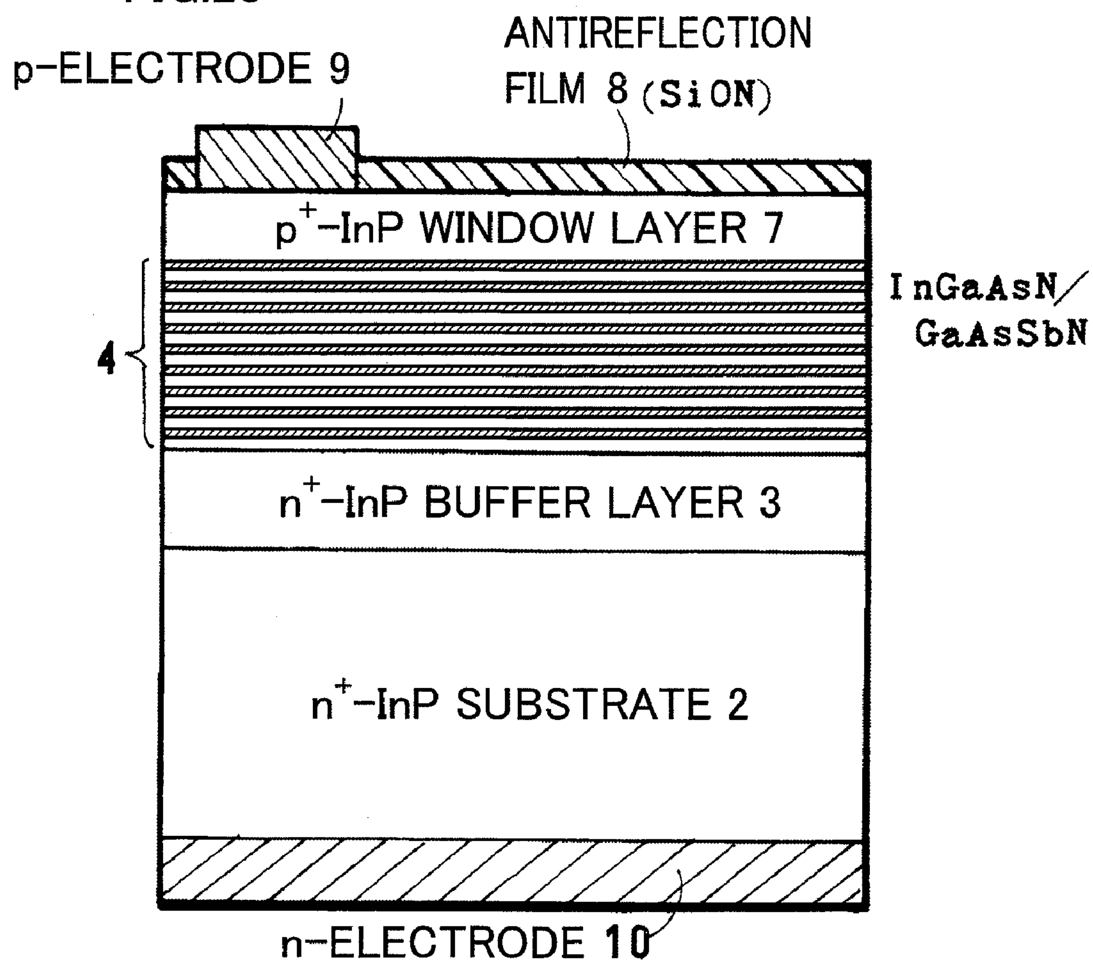
FIG. 22 is a cross-sectional view of a light-receiving layer of the photodiode for mid-infrared light in accordance with Example 6 of the present invention in which a superlattice made of a repetition of $In_{0.55}Ga_{0.44}As_{0.98}Sb_{0.01}N_{0.01}$/$GaAs_{0.338}Sb_{0.642}P_{0.01}N_{0.01}$ is formed as a light-receiving layer.
FIG. 23 is a cross-sectional view of a photodiode chip for mid-infrared light in accordance with the present invention in which a superlattice made of a repetition of InGaAsN/GaAsSbN formed on an InP substrate is formed as a light-receiving layer.

FIG. 23 shows a cross-sectional view of a photodiode as a whole. FIG. 12 shows a cross-sectional view of a superlattice light-receiving layer. Sulfur (S)-doped $n^+$-InP substrate 2 was prepared. The n-type carrier concentration was $2\times10^{18}$ $cm^3$. An Si-doped $n^+$-InP buffer layer 3 was grown to a thickness of 2 μm on $n^+$-InP substrate 2. Furthermore, superlattice light-receiving layer 4 of InGaAsN/GaAsSb was formed by MBE. The mixed crystal ratio of superlattice light-receiving layer 4 is $In_{0.56}Ga_{0.44}As_{0.99}N_{0.01}$/$GaAs_{0.51}Sb_{0.49}$. The thickness of the InGaAsN layer is 5 nm and the thickness of GaAsSb is 5 nm. In other words, the thickness of one period (one pair) is 10 nm. Here, 200 pairs were stacked. The total thickness of superlattice light-receiving layer 4 is 2000 nm (2 μm). A Be-doped $p^+$-InP window layer 7 was epitaxially grown to a thickness of 1 μm on superlattice light-receiving layer 4.

For epitaxial growth, an MBE apparatus was used. An n-type InP wafer was held to a substrate holder in the middle of the MBE apparatus and heated by a heater from the back. The substrate temperature was set to 470° C. A proper number of molecular beam cells were provided under the substrate holder. Gallium (Ga), indium (In), arsenic (As), antimony (Sb) were applied by solid source cells. The molecular beam cell was formed by surrounding a PBN (pyrolytic boron nitride) crucible with a heater and in addition with a reflector of a metal thin piece. A solid material was put into the PBN crucible and vaporized by heater heating. Nitrogen (N) was applied by an ECR plasma cell. A magnetic field in the vicinity of 875 gauss was formed in the longitudinal direction, and with application of microwave of 9.5 GHz, the microwave is resonated with electron motion thereby increasing the opportunities of collision with nitrogen, so that nitrogen was converted into plasma. The microwave power was 40 W and the nitrogen flow rate was 0.7 sccm. The supply cut-off of molecular beams was performed by opening/closing a shutter.

Figure 1:
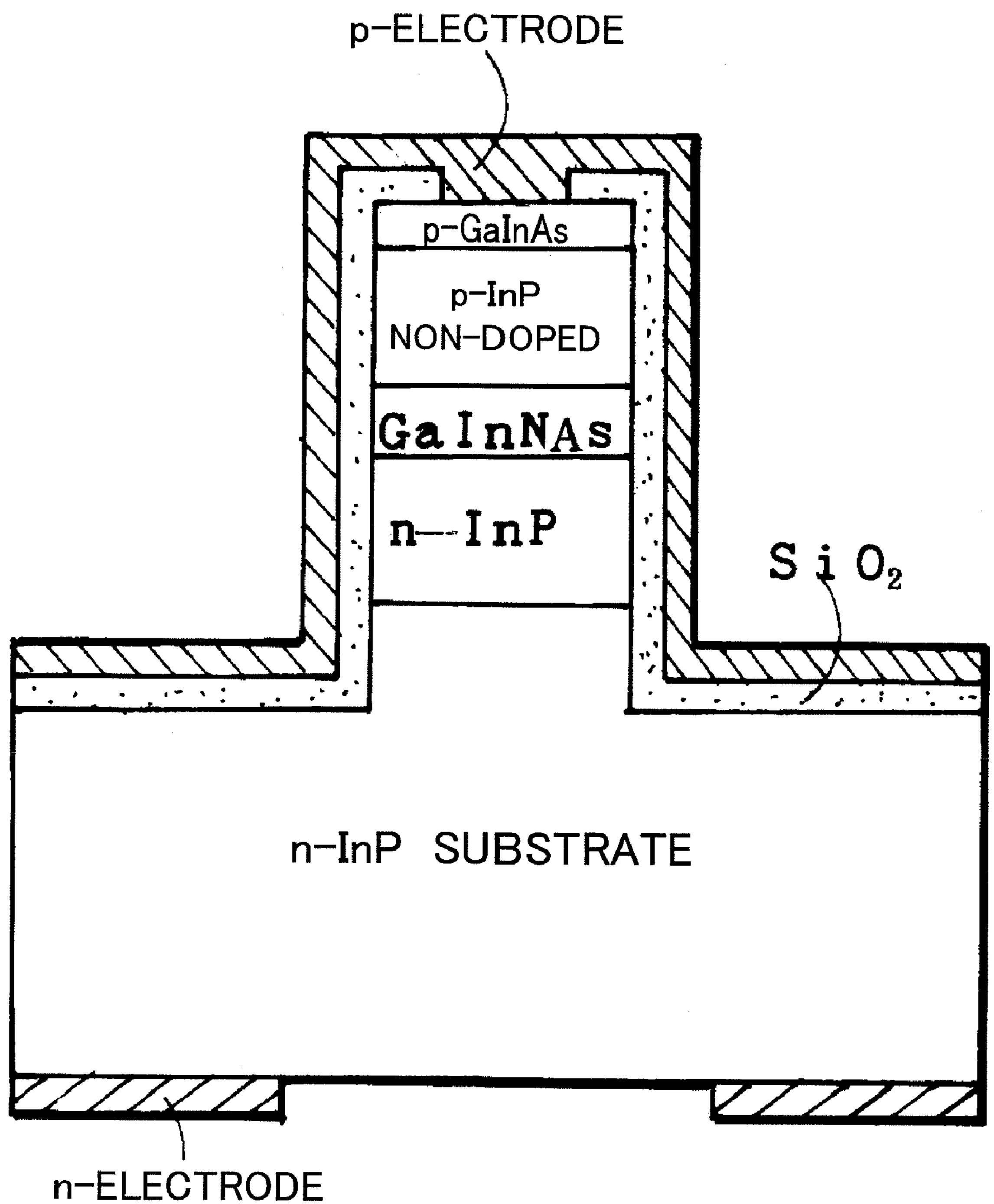
FIG. 1 is a longitudinal sectional view showing a photodiode structure proposed by Japanese Patent Laying-Open No. 09-219563 as a conventional example.
Figure 2:
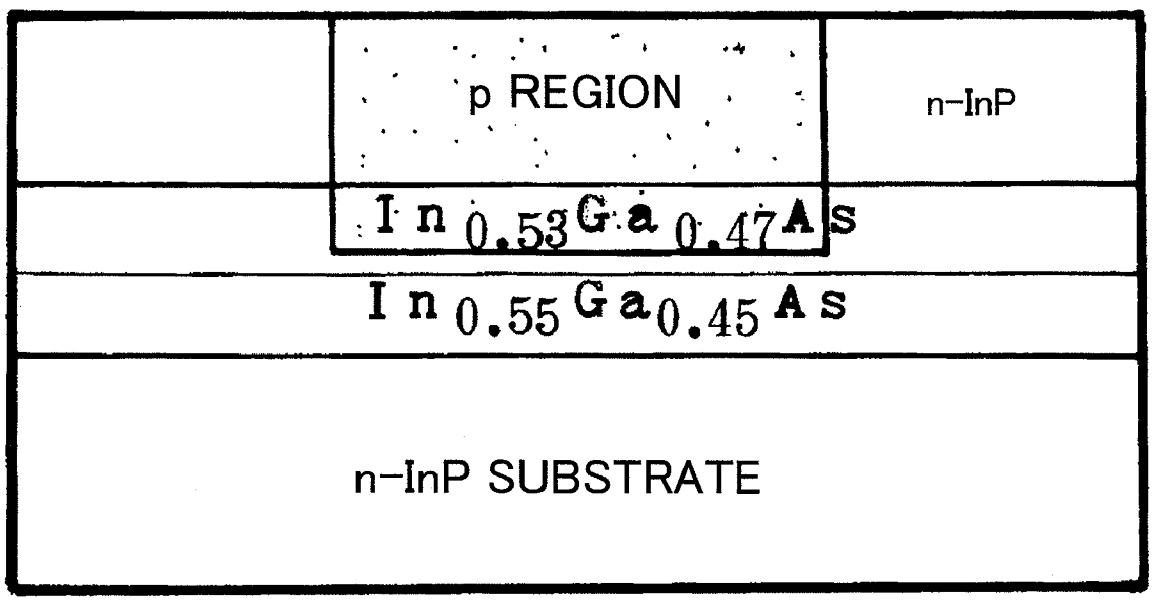
FIG. 2 is a longitudinal sectional view showing a photodiode proposed by Japanese Patent Laying-Open No. 2003-282927 as a conventional example.
Figure 3:
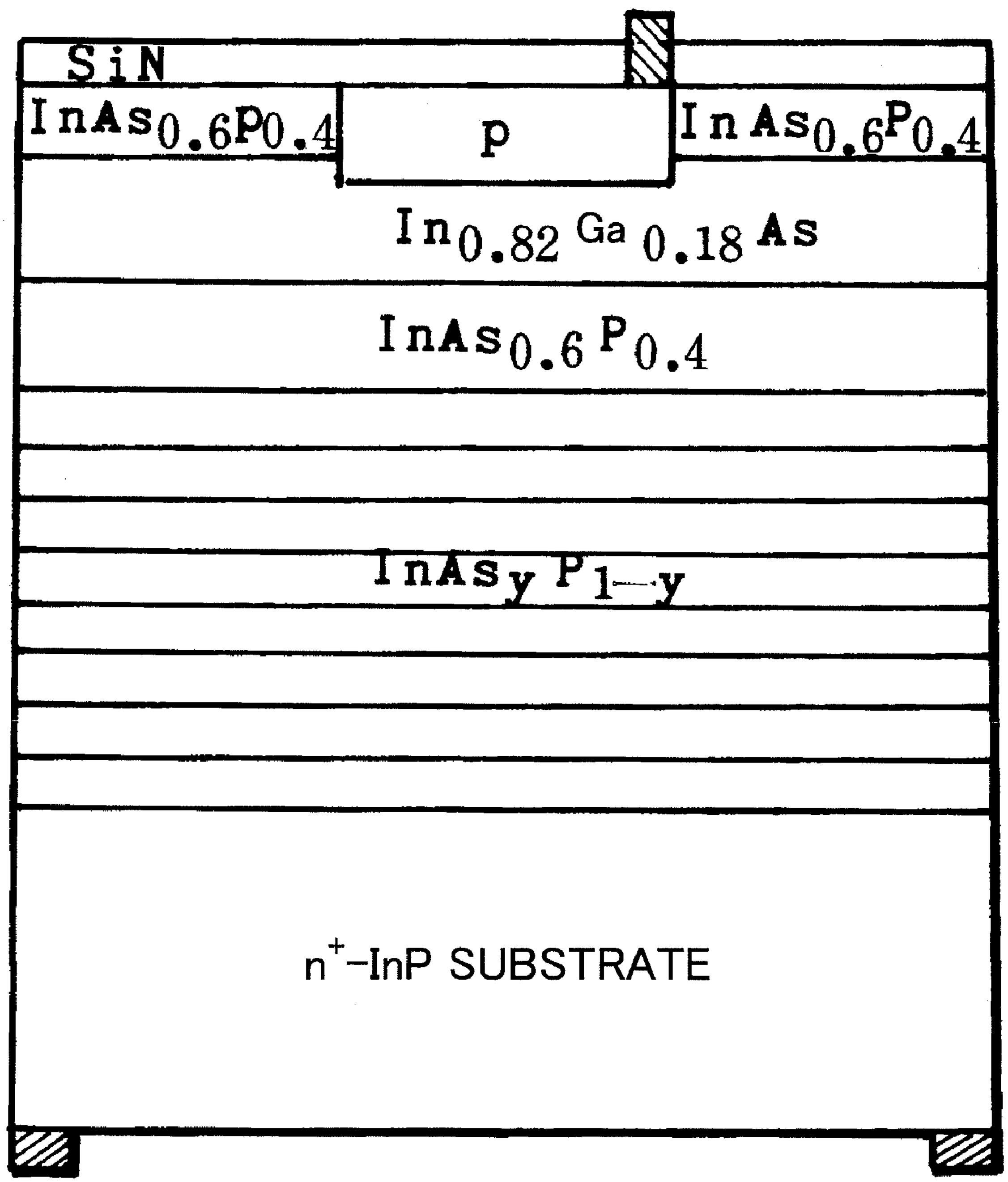
FIG. 3 is a longitudinal sectional view of a photodiode for near infrared light proposed by Non-Patent Document 1, as a conventional example, T. Murakami et al., "$In_yGa_{1-x}As/InAs_yP_{1-y}$, detector for near infrared (1-2.6 μm)," Conference Proceedings of Indium Phosphide and Related Materials.
Figure 4:
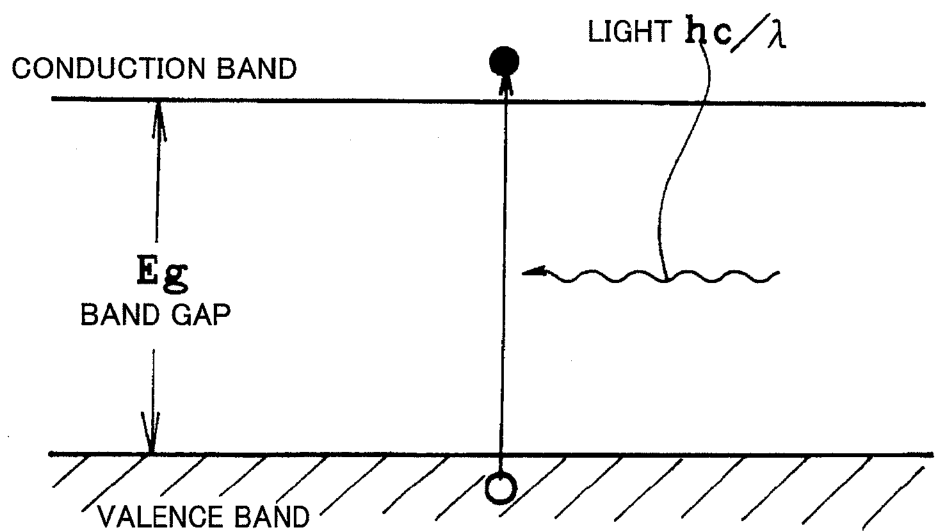
FIG. 4 is a semiconductor band diagram showing that light with energy of band gap Eg or greater is absorbed so that an electron in a valence band is lifted to a conduction band.
Figure 5:
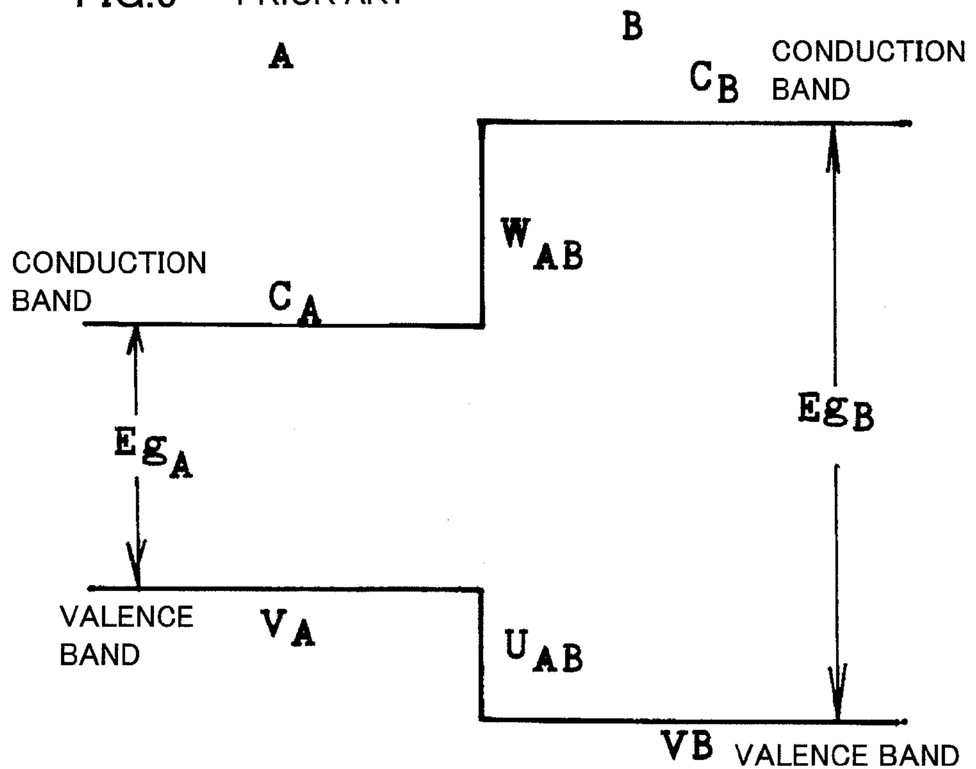
FIG. 5 is a band diagram showing a type 1 junction in which, when two kinds of semiconductors with different band gaps are joined, the conduction band and the valence band of a semiconductor having a narrow band gap is sandwiched between the conduction band and the valence band of a semiconductor having a wide band gap.
Figure 6:
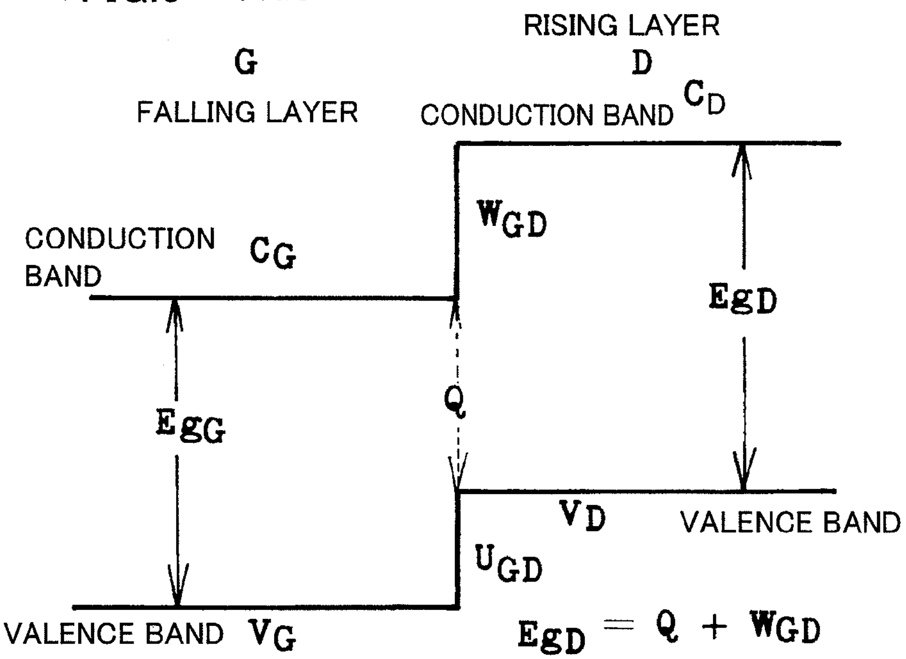
FIG. 6 is a band diagram showing a type 2 junction in which, when two kinds of semiconductors with different band gaps are joined, both the conduction band and the valence band of one are higher in energy level than the conduction band and the valence band of the other.
Figure 7:
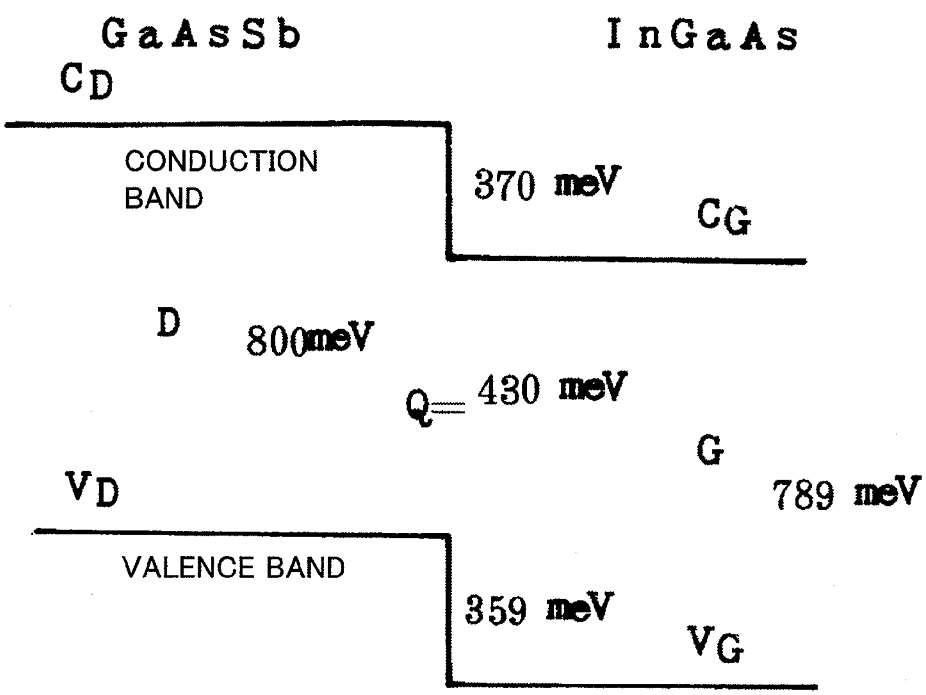
FIG. 7 is a junction cross-sectional view showing that GaAsSb/InGaAs junction is a type 2 junction as proposed in Non-Patent Document 3, A. Yamamoto, Y. Kawamura, H. Naito & N. Inoue, "Optical properties of $GaAs_{0.5}Sb_{0.5}$ and $In_{0.53}Ga_{0.47}As/GaAs_{0.5}Sb_{0.5}$ type II single hetero-structures lattice-matched to InP substrates grown by molecular beam epitaxy," Journal of Crystal Growth, Vol. 201/202, pp 872-876, May 1999.
Figure 8:
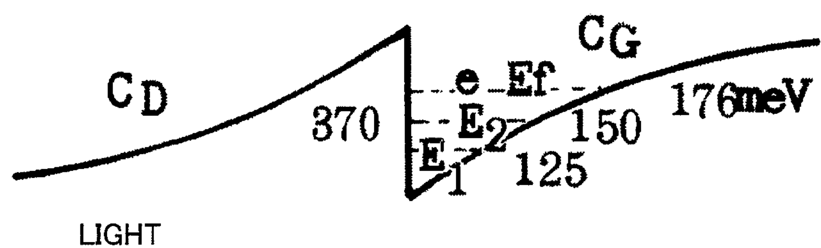
FIG. 8 is a junction cross-sectional view showing that GaAsSb/InGaAs junction is a type 2 junction as proposed in Non-Patent Document 3, A. Yamamoto, Y. Kawamura, H. Naito & N. Inoue, "Optical properties of $GaAs_{0.5}Sb_{0.5}$ and $In_{0.53}Ga_{0.47}As/GaAs_{0.5}Sb_{0.5}$ type II single hetero-structures lattice-matched to InP substrates grown by molecular beam epitaxy," Journal of Crystal Growth, Vol. 201/202, pp 872-876, May 1999, and that the band is curved in the vicinity of the junction because of a depletion layer.
Figure 8:
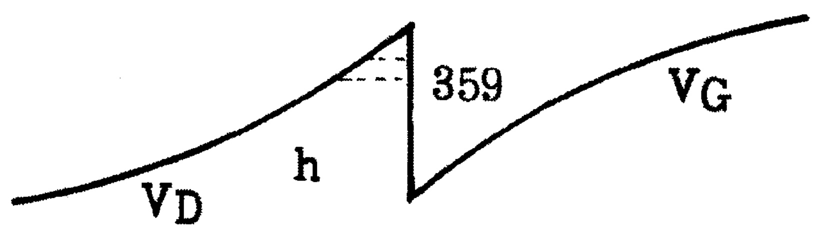
Figure 9:
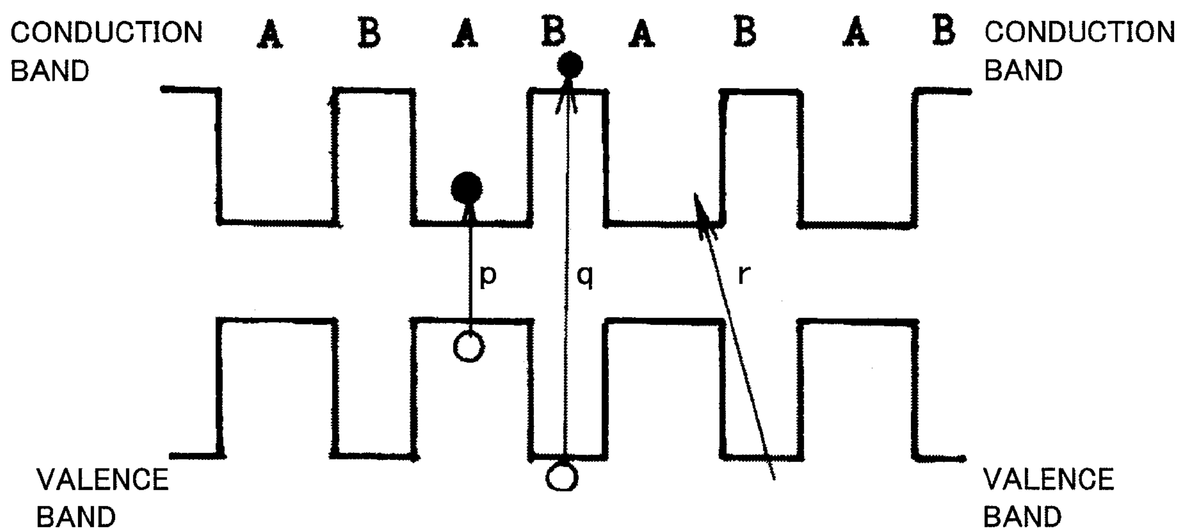
FIG. 9 is a band diagram in a case where a superlattice is formed of a combination of semiconductors A, B having a type 1 junction in which the conduction band and the valence band of the semiconductor having a narrow band gap is sandwiched between the conduction band and the valence band of the semiconductor having a wide band gap.
Figure 10:
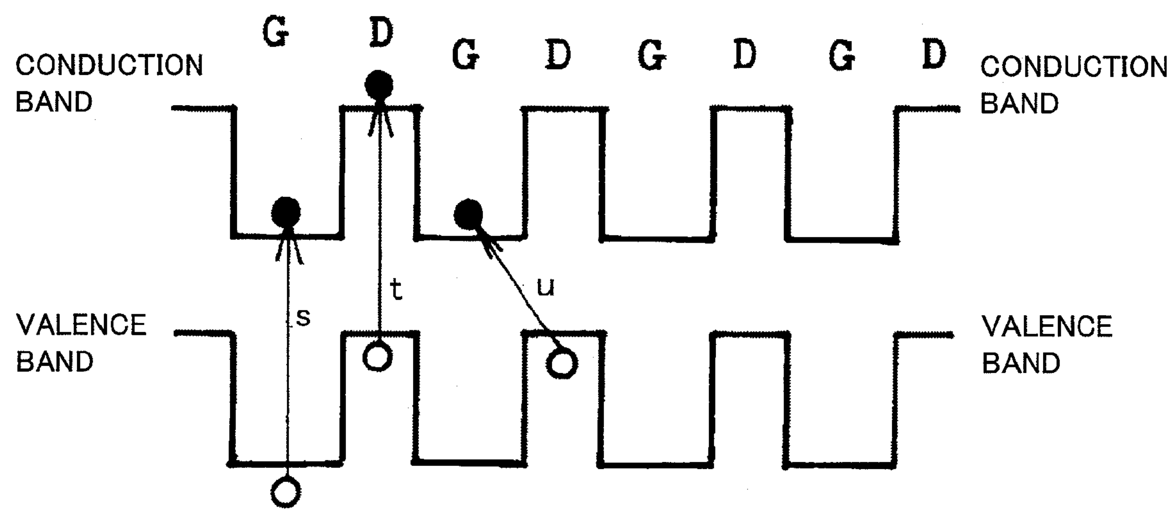
FIG. 10 is a band diagram in a case where a superlattice is formed of a combination of semiconductors C, D having a type 2 junction in which both of the conduction band and the valence band of one semiconductor (rising layer) are higher in energy level than the conduction band and the valence band of the other (falling layer).
Figure 11:
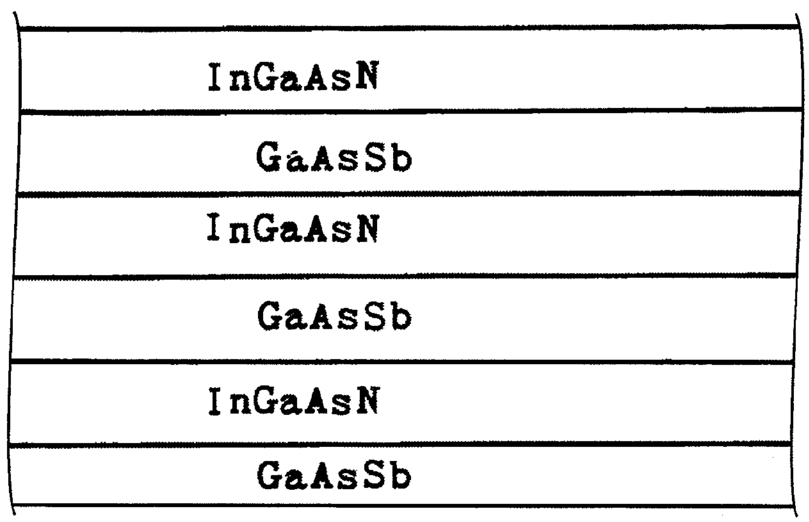
FIG. 11 is a cross-sectional view of a light-receiving layer of a photodiode for mid-infrared light according to the present invention in which a superlattice made of a repetition of InGaAsN/GaAsSb is formed as a light-receiving layer.

As the type 2 junction is to be fabricated, electron-hole makes an intersection transition with application of light, as shown in FIG. 10. The intersection band gap is 3.0 μm. With light of 2.5 μm, photocurrent flowed. A photodiode sensible to mid-infrared light up to 2.8 μm was thus fabricated.

Figure 25:
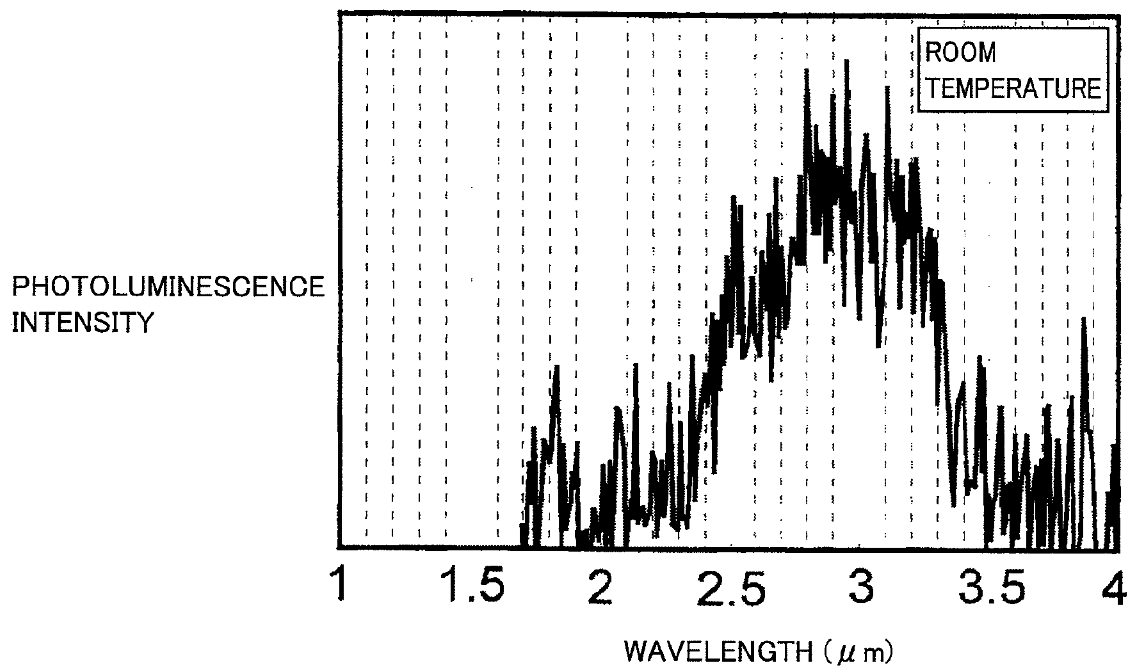
FIG. 25 is a graph showing a photoluminescence measurement result of a crystal film formed by being stacked ten pairs of InGaAsN/GaAsSb in Example 1.

In addition, in the foregoing configuration, a photodiode which was different in that not 200 pairs but only 10 pairs of InGaAsN/GaAsSb were stacked was fabricated, and photoluminescence of this photodiode was measured. The measurement result is as shown in FIG. 25. It is noted that FIG. 25 shows the photoluminescence measurement result of a crystal film in which 10 pairs of InGaAsN/GaAsSb are stacked.

Example 2

Example 2 Quantum Well Light-Receiving Layer of InGaAsN/GaAsSbN (FIG. 14)

The cross-sectional view of the entire photodiode is similar to that shown in FIG. 23. FIG. 14 shows a cross-sectional view of the superlattice light-receiving layer. As compared with Example 1, nitrogen N is added as a component of a D-type layer. Specifically, Si-doped $n^+$-InP buffer layer 3 was grown to a thickness of 2 μm on sulfur (S)-doped $n^\pm$-InP substrate 2, and superlattice light-receiving layer 4 of InGaAsN/GaAsSbN was formed by MBE. The mixed crystal ratio of superlattice light-receiving layer 4 is $In_{0.56}Ga_{0.44}As_{0.99}N_{0.01}$/$GaAs_{0.496}Sb_{0.499}N_{0.005}$. The thickness of the InGaAsN layer is 5 nm, and the thickness of GaAsSbN is 5 nm. The thickness of one period is 10 nm. Here, 200 pairs were stacked. The total thickness of superlattice light-receiving layer 4 is 2000 nm (2 μm). Be-doped pt-InP window layer 7 was epitaxially grown to a thickness of 1 μm on superlattice light-receiving layer 4. This was also grown by MBE. The nitrogen cell was an ECR cell, and a solid material cell was used for the other materials.

This also formed the type 2 junction. The intersection band gap is about 3.0 μm. The photodiode was sensible to mid-infrared up to about 2.8 μm.

Example 3

Example 3 Quantum Well Light-Receiving Layer of InGaAsSbN/GaAsSb (FIG. 16)

The cross-sectional view of the entire photodiode is similar to that shown in FIG. 23. FIG. 16 shows a cross-sectional view of the superlattice light-receiving layer. As compared with Example 1, antimony (Sb) is added as a component of the G-type layer. Specifically, Si-doped $n^+$-InP buffer layer 3 was grown to a thickness of 2 μm on sulfur (S)-doped $n^+$-InP substrate 2, and superlattice light-receiving layer 4 of InGaAsSbN/GaAsSb was formed by MBE. The mixed crystal ratio of superlattice light-receiving layer 4 is $In_{0.58}Ga_{0.42}As_{0.969}Sb_{0.01}N_{0.021}$/$GaAs_{0.51}Sb_{0.49}$. The thickness of the InGaAsSbN layer is 7 nm, and the thickness of GaAsSb is 3 nm. The thickness of one period is 10 nm. Here, 200 pairs were stacked. The total thickness of superlattice light-receiving layer 4 is 2000 nm (2 μm). Be-doped $p^+$-InP window layer 7 was epitaxially grown to a thickness of 1 μm on superlattice light-receiving layer 4. This was also grown by MBE. The nitrogen cell was an ECR cell, and a solid material cell was used for the other materials.

This also formed the type 2 junction. The intersection band gap is about 3.5 μm. The photodiode was sensible to mid-infrared up to about 3.3 μm.

Example 4

Example 4 Quantum Well Light-Receiving Layer of InGaAsSbN/GaAsSbN (FIG. 18)

The cross-sectional view of the entire photodiode is similar to that shown in FIG. 23. FIG. 18 shows a cross-sectional view of the superlattice light-receiving layer. As compared with Example 1, antimony (Sb) is added as a component of the G-type layer, and nitrogen (N) is added as a component of the D-type layer. Specifically, Si-doped $n^+$-InP buffer layer 3 was grown to a thickness of 2 μm on sulfur (S)-doped $n^+$-InP substrate 2, and superlattice light-receiving layer 4 of InGaAsSbN/GaAsSbN was formed by MBE. The mixed crystal ratio of superlattice light-receiving layer 4 is $In_{0.58}Ga_{0.42}As_{0.969}Sb_{0.01}N_{0.021}/GaAs_{0.496}Sb_{0.499}N_{0.005}$. The thickness of the InGaAsSbN layer is 6 nm, and the thickness of GaAsSbN is 4 nm. The thickness of one period is 10 nm. Here, 200 pairs were stacked. The total thickness of superlattice light-receiving layer 4 is 2000 nm (2 μm). Be-doped $p^+$-InP window layer 7 was epitaxially grown to a thickness of 1 μm on superlattice light-receiving layer 4. This was also grown by MBE. The nitrogen cell was an ECR cell, and a solid material cell was used for the other materials.

This also formed the type 2 junction. The intersection band gap is about 3.5 μm. The photodiode was sensible to mid-infrared up to about 3.3 μm.

Example 5

Example 5 Quantum Well Light-Receiving Layer of InGaAsSbPN/GaAsSbN (FIG. 20)

The cross-sectional view of the entire photodiode is similar to that shown in FIG. 23. FIG. 20 shows a cross-sectional view of the superlattice light-receiving layer. As compared with Example 1, antimony (Sb) and phosphorous (P) are added as components of the G-type layer, and nitrogen (N) is added as a component of the D-type layer. Specifically, Si-doped $n^+$-InP buffer layer 3 was grown to a thickness of 2 μm on sulfur (S)-doped $n^+$-InP substrate 2, and superlattice light-receiving layer 4 of InGaAsSbPN/GaAsSbN was formed by MBE. The mixed crystal ratio of superlattice light-receiving layer 4 is $In_{0.5}Ga_{0.5}As_{0.955}Sb_{0.02}P_{0.01}N_{0.015}/GaAs_{0.476}Sb_{0.514}N_{0.01}$. The thickness of the InGaAsSbPN layer is 5 nm, and the thickness of GaAsSbN is 5 nm. The thickness of one period is 10 nm. Here, 200 pairs were stacked. The total thickness of superlattice light-receiving layer 4 is 2000 nm (2 μm). Be-doped $p^+$-InP window layer 7 was epitaxially grown to a thickness of 1 μm on superlattice light-receiving layer 4. This was also grown by MBE. The nitrogen cell was an ECR cell, and a solid material cell was used for the other materials.

This also formed the type 2 junction. The intersection band gap is about 3.3 μm. The photodiode was sensible to mid-infrared up to about 3.1 μm.

Example 6

Example 6 Quantum Well Light-Receiving Layer of InGaAsSbN/GaAsSbPN (FIG. 22)

The cross-sectional view of the entire photodiode is similar to that shown in FIG. 23. FIG. 22 shows a cross-sectional view of the superlattice light-receiving layer. As compared with Example 1, antimony (Sb) is added as a component of the G-type layer, and nitrogen (N) and phosphorous (P) are added as components of the D-type layer. Si-doped $n^+$-InP buffer layer 3 was grown to a thickness of 2 μm on sulfur (S)-doped $n^+$-InP substrate 2, and superlattice light-receiving layer 4 of InGaAsSbN/GaAsSbPN was formed by MBE. The mixed crystal ratio of superlattice light-receiving layer 4 is $In_{0.55}Ga_{0.45}As_{0.98}Sb_{0.01}N_{0.01}/GaAs_{0.338}Sb_{0.642}P_{0.01}N_{0.01}$. The thickness of the InGaAsSbN layer is 5 nm, and the thickness of GaAsSbPN is 5 nm. The thickness of one period is 10 nm. Here, 200 pairs were stacked. The total thickness of superlattice light-receiving layer 4 is 2000 nm (2 μm). Be-doped $p^+$-InP window layer 7 was epitaxially grown to a thickness of 1 μm on superlattice light-receiving layer 4. This was also grown by MBE. The nitrogen cell was an ECR cell, and a solid material cell was used for the other materials.

This also formed the type 2 junction. The intersection band gap is about 3.1 μm. The photodiode was sensible to mid-infrared up to about 2.9 μm.

Example 7

Example 7 Quantum Well Light-Receiving Layer of InGaAsN/GaAsSb (FIG. 12)

Figure 26:
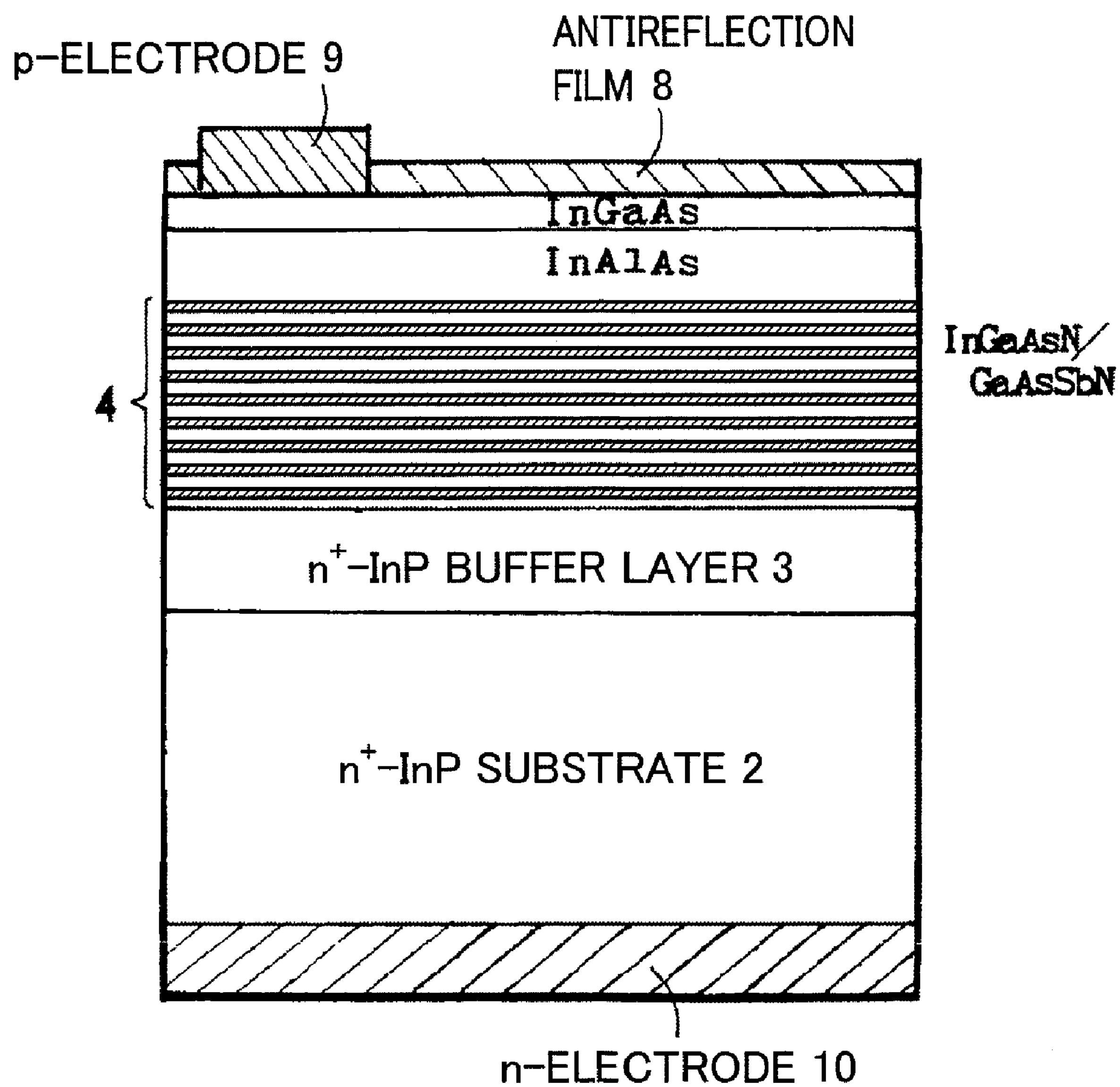
FIG. 26 is a cross-sectional view of a photodiode chip for mid-infrared light in accordance with the present invention in which a superlattice made of a repetition of InGaAsN/GaAsSbN formed on an InP substrate is formed as a light-receiving layer. Here, instead of InP, InAlAs+InGaAs is formed as a window layer.

FIG. 26 shows a cross-sectional view of the entire photodiode. FIG. 12 shows a cross-sectional view of the superlattice light-receiving layer. Sulfur (S)-doped $n^+$-InP substrate 2 was prepared. The n-type carrier concentration was $2\times10^{18}$ $cm^3$. Si-doped $n^+$-InP buffer layer 3 was grown to a thickness of 2 μm on $n^+$-InP substrate 2. In addition, superlattice light-receiving layer 4 of InGaAsN/GaAsSb was formed by MBE. The mixed crystal ratio of superlattice light-receiving layer 4 is $In_{0.56}Ga_{0.44}As_{0.99}N_{0.01}/GaAs_{0.51}Sb_{0.49}$. The thickness of the InGaAsN layer is 5 nm, and the thickness of GaAsSb is 5 nm. The thickness of one period is 10 nm. Here, 200 pairs were stacked. The total thickness of superlattice light-receiving layer 4 is 2000 nm (2 μm). A Be-doped InAlAs+InGaAs window layer was epitaxially grown on superlattice light-receiving layer 4. The thickness of InAlAs is 1 μm and the thickness of InGaAs is 0.2 μm. Since InAlAs has a band gap equivalent to InP and thus is effective in blocking leak current. However, because of inclusion of Al, it has the drawback of easily being oxidized and is thus capped with InGaAs. It is noted that the passivation film formation technique for InGaAs is established.

Example 8

Figure 24:
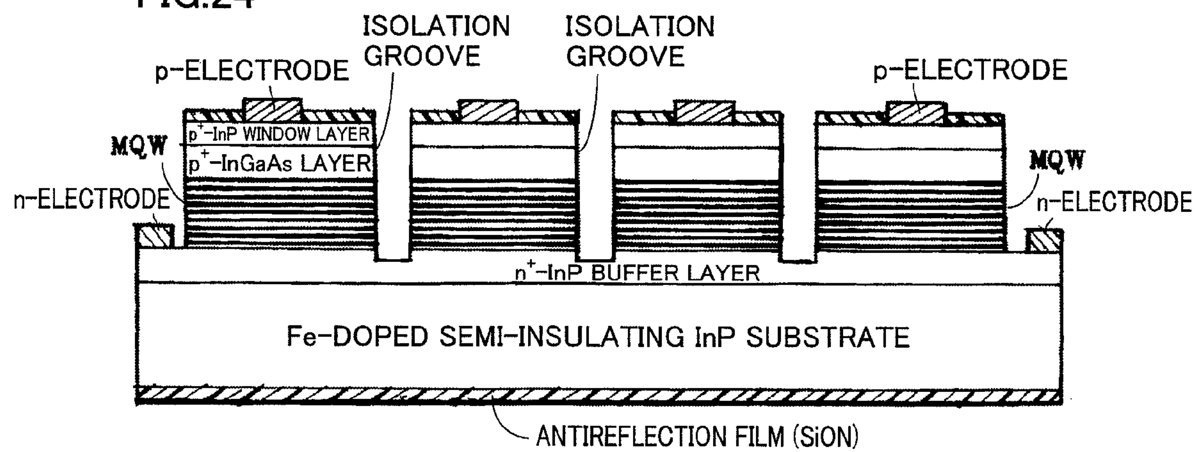
FIG. 24 is a cross-sectional view of a 1×4 photodiode array for mid-infrared light in which a superlattice having a type 2 junction and made of a repetition of rising layer D and falling layer G formed on an InP substrate is formed as a light-receiving layer.

FIG. 24 shows a structure example of a photodiode array for mid-infrared. An iron (Fe)-doped semi-insulating (SI) InP wafer is used as a substrate. This is a back-illuminated type. In order to reduce absorption of light applied from the back, semi-insulating InP having high transparency is used as a substrate. An $n^+$-InP buffer layer, a multiquantum well structure (MQW), a $p^+$-InGaAs layer, a $p^+$-InP window layer are epitaxially grown in order on the InP substrate. The $n^+$-InP buffer layer has a thickness of 2 μm and is doped with Si and the n-type carrier concentration (electron) is $n=5\times10^{17}$ $cm^{-3}$. The multiquantum well (MQW) is comprised of a repetition of a falling layer G and a rising layer D each having a thickness of 3 nm-10 nm and forms a type 2 junction.

The following materials were employed for falling layer G and rising layer D, respectively.

Falling layer G=InGaAsN, InGaAsSbN, InGaAsSbPN

Rising layer D=GaAsSb, GaAsSbN, GaAsSbPN

The $p^+$-InGaAs layer has a thickness of 0.5 μm and is Be-doped p-type, and the p-type carrier concentration (hole) is $p=5\times10^{-18}$ $cm^{-3}$. The $p^+$-InP window layer has a thickness of 0.5 μm and is Be-doped p-type, and the p-type carrier concentration (hole) is $p=3\times10^{18}$ $cm^{-3}$.

An SiON (silicon oxynitride film) antireflection film is formed on the back surface of the SI-InP substrate so that incident light is not reflected here. A p-electrode is provided on the $p^+$-InP window layer. An isolation groove is cut into the $n^+$-InP buffer layer to achieve element isolation in the photodiodes constituting the array. The $n^+$-InP buffer layer is partially exposed to be provided with an n-electrode.

In this example, an 1×4 array is provided, although the number of elements in rows and columns are arbitrary. For example, a 4×4 array or 4×16, 32×32 arrays may be formed.

Although the embodiment and examples of the present invention have been described in the foregoing, the embodiment and examples disclosed in the foregoing are illustrative, and the scope of the present invention is not limited to the embodiments of the present invention. The scope of the present invention is shown in the claims, and it is intended that all the equivalencies to the claims and the modifications within the claims should be embraced.

The invention claimed is:

1. A light-receiving device comprising:

an InP substrate;

a superlattice light-receiving layer comprising multiple layers of a falling layer lattice-matched to InP and made of a Group III-V mixed crystal at least including In, Ga, As, and N in which a valence band and a conduction band fall in energy level at a heterojunction, and a rising layer lattice-matched to InP and made of a group III-V mixed crystal at least including Ga, As, Sb, and N in which a valence band and a conduction band rise in energy level at a heterojunction; and a pn junction formed at said superlattice light-receiving layer.

2. The light-receiving device according to claim 1, wherein the composition of said falling layer is InGaAsN.

3. The light-receiving device according to claim 1, wherein the composition of said falling layer is InGaAsSbN.

4. The light-receiving device according to claim 1, wherein the composition of said falling layer is InGaAsSbPN.

5. The light-receiving device according to claim 1, wherein the composition of said rising layer is GaAsSbN.

6. The light-receiving device according to claim 1, wherein the composition of said rising layer is GaAsSbPN.

7. The light-receiving device according to claim 1, wherein a thickness of said superlattice light-receiving layer as a whole is 2 μm-7 μm.

8. The light-receiving device according to claim 1, wherein lattice mismatch of said rising layer and said falling layer constituting said superlattice light-receiving layer to said InP substrate is −0.2%-+0.2%.

9. The light-receiving device according to claim 1, further comprising an InP window layer.

10. The light-receiving device according to claim 1, further comprising:

an InAlAs layer provided on said superlattice light-receiving layer; and an InGaAs layer provided on said InAlAs layer.

* * * * *